United States Patent [19]

Isaka et al.

[11] Patent Number: 5,038,166
[45] Date of Patent: Aug. 6, 1991

[54] OPTICAL IMAGE RECORDING APPARATUS

[75] Inventors: Kazuo Isaka, Tokyo; Shuzo Kaneko, Yokohama; Akihiro Mouri, Atsugi; Kazuo Yoshinaga, Tokyo; Toshikazu Ohnishi, Atsugi; Yutaka Kurabayashi, Yokohama; Yomishi Toshida, Yokohama; Takeo Eguchi, Atsugi, all of Japan

[73] Assignee: Canon Kabushiki Kaisha, Tokyo, Japan

[21] Appl. No.: 291,443

[22] Filed: Dec. 28, 1988

[30] Foreign Application Priority Data

Dec. 29, 1987 [JP] Japan .................................. 62-336124
Jun. 3, 1988 [JP] Japan .................................. 63-135468

[51] Int. Cl.$^5$ ...................... G03B 27/52; G01D 15/12
[52] U.S. Cl. .................................. 355/27; 346/76 PH
[58] Field of Search .................. 346/76 PH; 355/151, 355/27; 219/216 PH; 400/120; 250/316.1-319

[56] References Cited

U.S. PATENT DOCUMENTS

| | | | |
|---|---|---|---|
| 4,499,458 | 2/1985 | Le Berre et al. | 340/713 |
| 4,514,744 | 4/1985 | Saitoh et al. | 346/76 PH X |
| 4,607,936 | 8/1986 | Miyakawa et al. | 355/210 |
| 4,734,359 | 3/1988 | Oguchi et al. | 430/945 |
| 4,777,492 | 10/1988 | Ohnishi et al. | 346/1.1 |
| 4,891,652 | 1/1990 | Sato et al. | 346/76 PH |
| 4,920,374 | 4/1990 | Sangyoji et al. | 355/27 |

FOREIGN PATENT DOCUMENTS 59-30537 2/1984 Japan .
62-174195 7/1987 Japan .

OTHER PUBLICATIONS

Wu, Alexander, Proceedings of the SID, "Optimizing the Printing Speed and Printout Quality of an Electrophotographic Laser-Beam Printer", vol. 21, No. 2, 1980, pp. 181-183.

*Primary Examiner*—L. T. Hix
*Assistant Examiner*—D. Rutledge
*Attorney, Agent, or Firm*—Fitzpatrick, Cella, Harper & Scinto

[57] ABSTRACT

An optical image recording apparatus includes an image holding member comprising a polymer recording layer capable of recording and holding data through heat application, thermal recording means for applying heat to the polymer recording layer, a photosensitive member, and exposure means for recording the data recorded by the recording layer by the photosensitive member. The polymer recording layer is preferably composed from a polymer liquid crystal. The polymer recording layer and the photosensitivie member can be provided in a laminated form. The data recorded on the photosensitive member may be subjected to an electrophotographic image forming process.

50 Claims, 17 Drawing Sheets

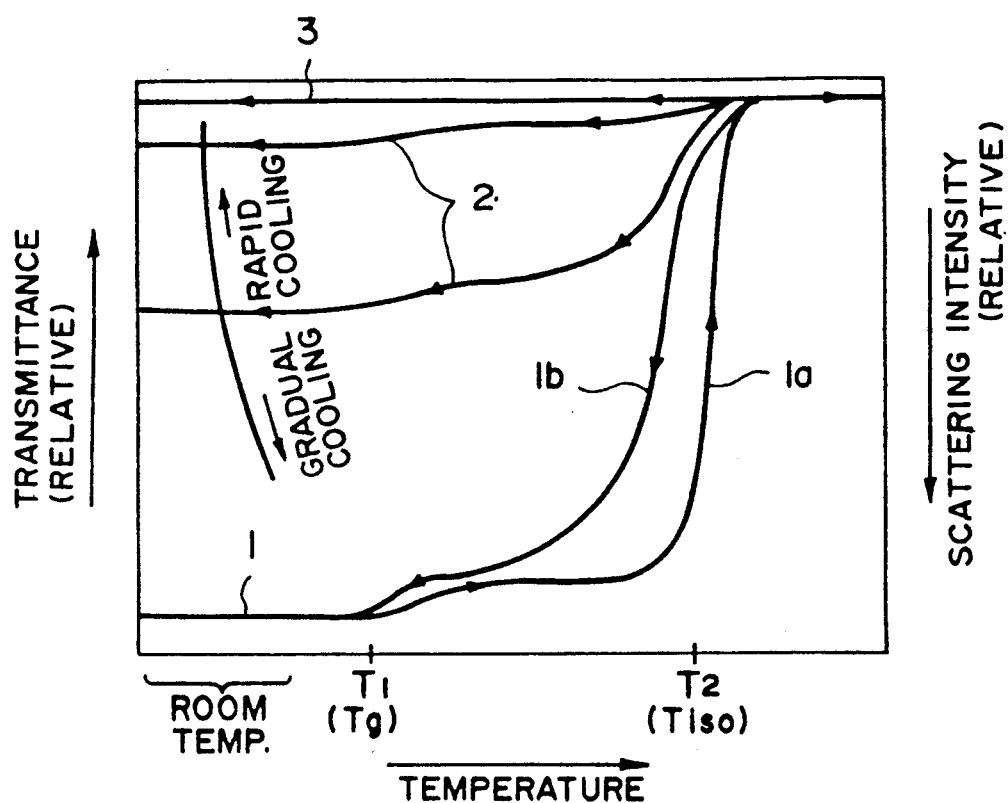
F I G. 1
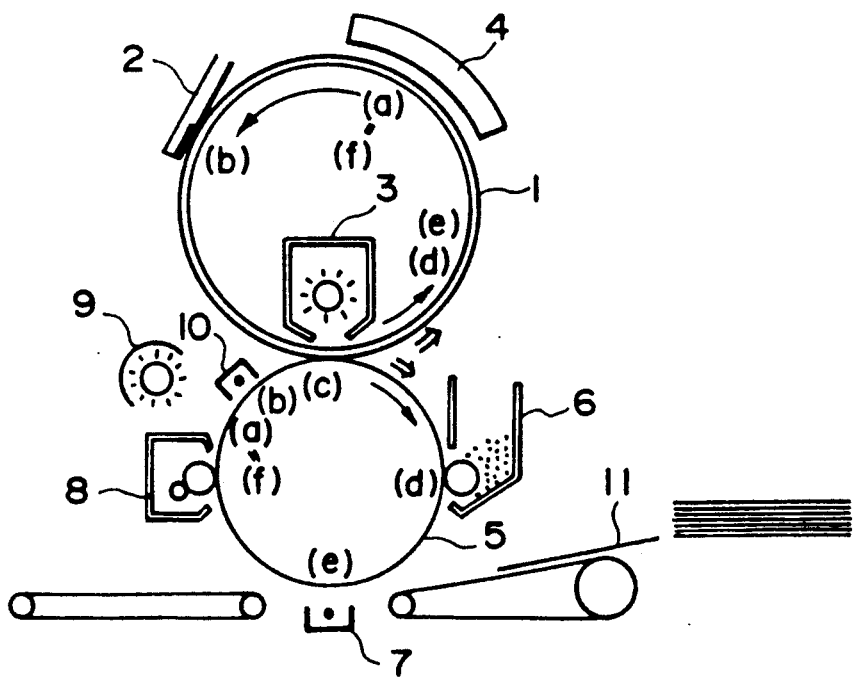
F I G. 2

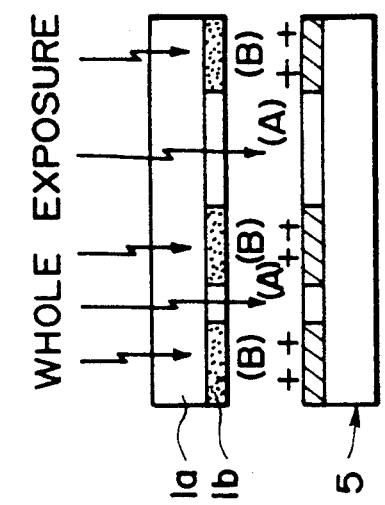
FIG. 3C
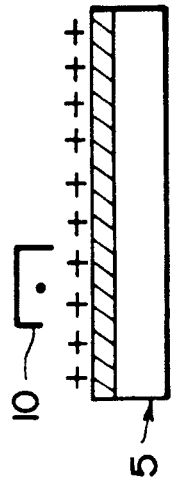
FIG. 3BA
FIG. 3BB
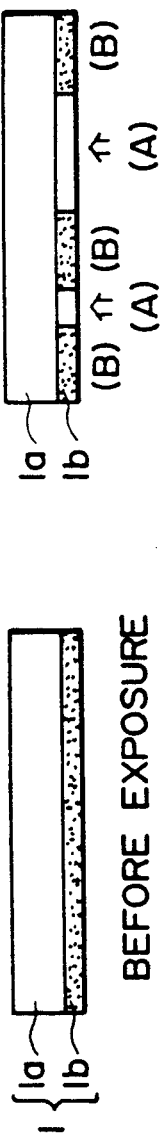
FIG. 3AA
FIG. 3AB

FIG. 3DA
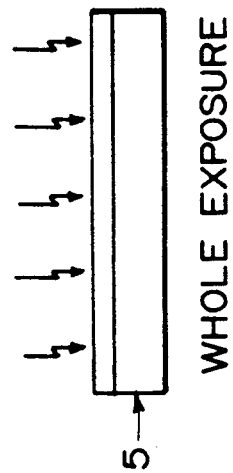
FIG. 3EA
FIG. 3FA WHOLE HEATING
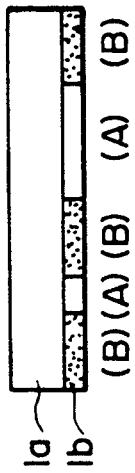
FIG. 3DB DEVELOPMENT
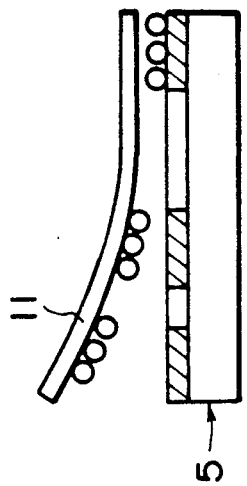
FIG. 3EB TRANSFER
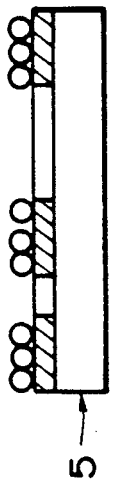
FIG. 3FB WHOLE EXPOSURE

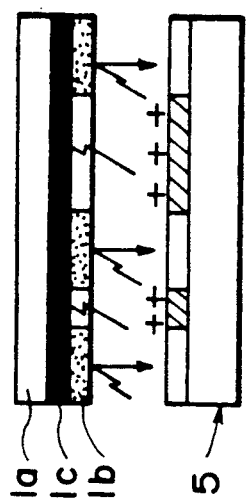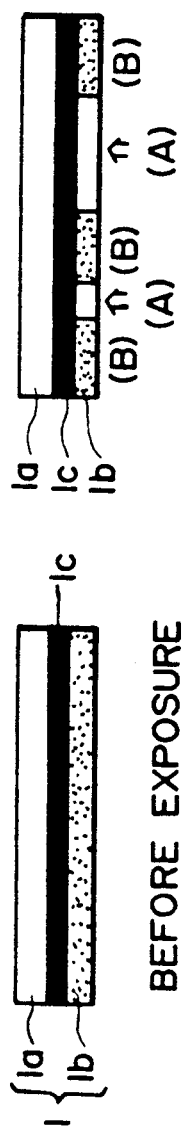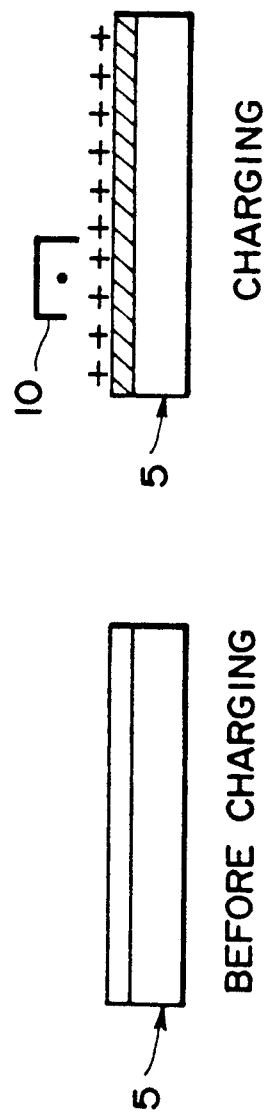
FIG. 5AA BEFORE EXPOSURE
FIG. 5AB BEFORE CHARGING
FIG. 5BA IMAGE HEATING
FIG. 5BB CHARGING
FIG. 5C WHOLE EXPOSURE / IMAGE EXPOSURE

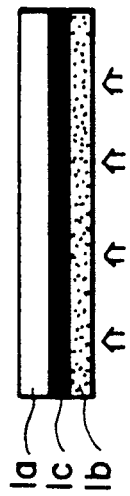
FIG. 5DA
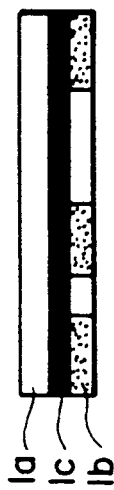
FIG. 5EA
FIG. 5FA  WHOLE HEATING
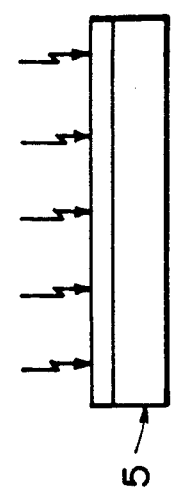
FIG. 5DB  DEVELOPMENT
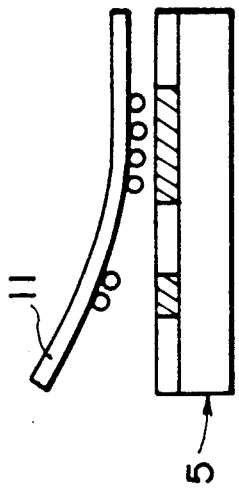
FIG. 5EB  TRANSFER
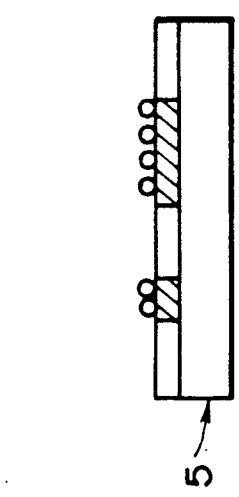
FIG. 5FB  WHOLE EXPOSURE

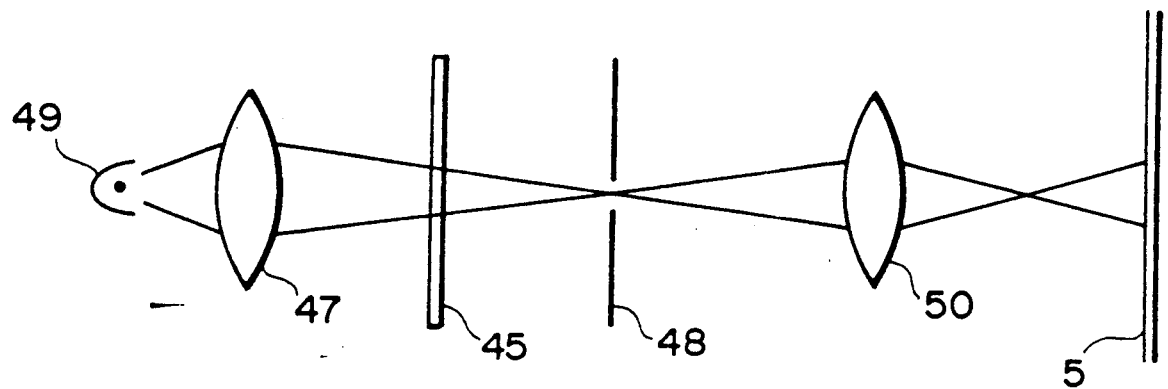
F I G. 12A
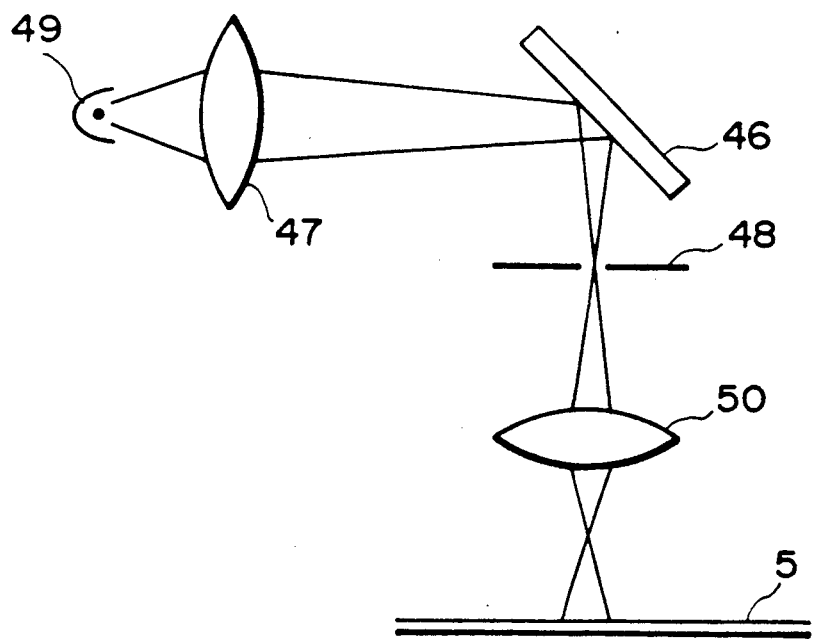
F I G. 12B

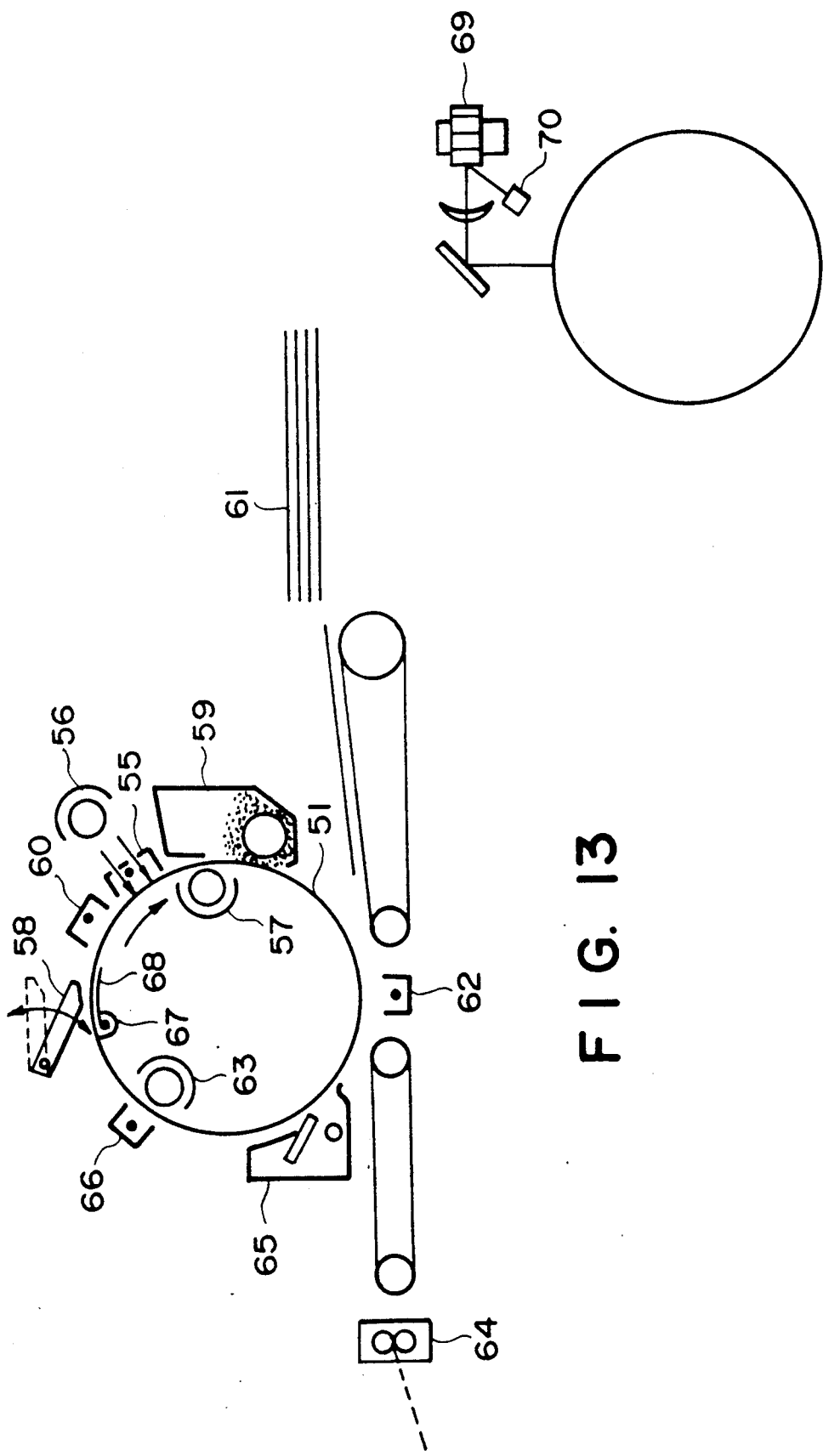

FIG. 14A
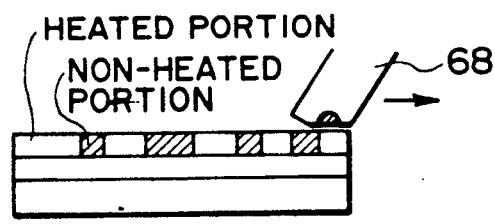
FIG. 14B
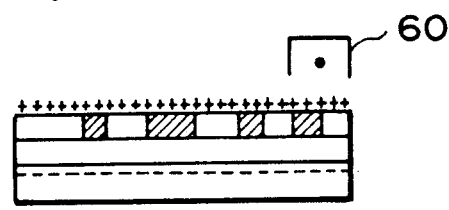
FIG. 14C
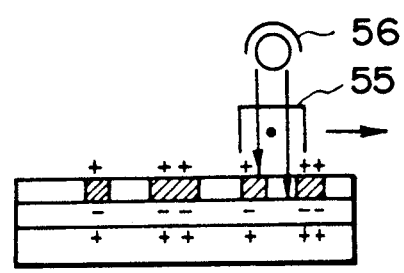
FIG. 14D
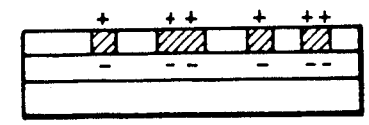
FIG. 14E
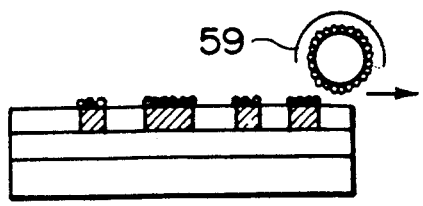
FIG. 14F
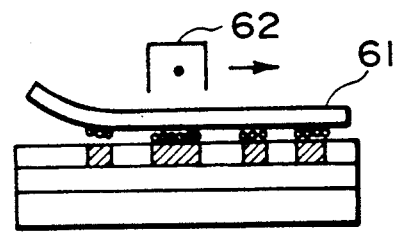
FIG. 14G
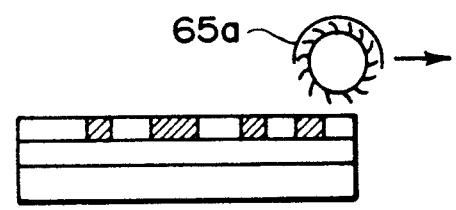
FIG. 14H
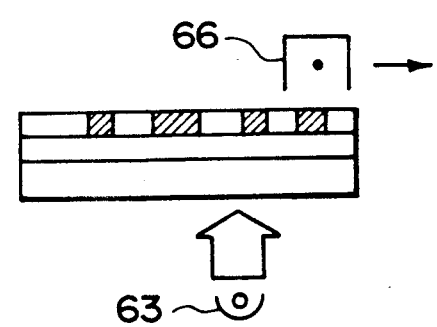
FIG. 14I
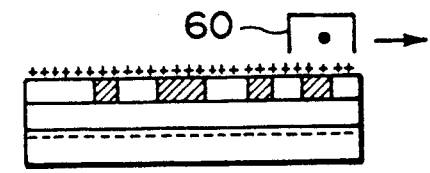
FIG. 14J

OPTICAL IMAGE RECORDING APPARATUS

FIELD OF THE INVENTION AND RELATED ART

The present invention relates to an image forming apparatus for outputting image signals read by a scanner, image signals or data signals held by an optical disk, a personal computer, etc., particularly an image recording apparatus capable of once outputting an image signal or data signal on an intermediate image holding member comprising a polymer layer and then recording an optical image on an image holding member such as an electrophotographic photosensitive member or silver salt. The present invention further relates to an image recording member capable of outputting and printing image signals read out electrically or magnetically or temporarily accumulated.

Hitherto, in a digital electrophotographic system, data signals have been recorded on a photosensitive member by scanning the photosensitive member with a semiconductor laser beam by the medium of a polygonal mirror while turning on and off the laser beam depending on given data signals. In this system, however, a high power of laser or continuous operation thereof is required in order to record fine images, or record images at a high speed, particularly in order to record identical images on a large number of sheets, so that a problem is liable to occur indurability of the laser per se. Further, in case of repetitive reading and recording of identical images, the optical scanner carries a large load. It is generally difficult to provide semiconductor suitable lasers usable as R, G and B laser light sources for color image formations, so that such color image formation has required a large and complicated apparatus.

In an analog recording system, there is known an electrophotographic system called a screen process wherein an intermediate image in the form of an ion image is recorded on an intermediate transfer medium. In this system, however, a problem of instability attributable to ion charge is involved, so that a long-term memory characteristic cannot be attained.

The diazo recording system for which a large demand is present because of a low running cost, has involved a problem such that it is not applicable to copying of a solid body nor is it applicable to copying of color images.

On the other hand, as image forming materials capable of reversible erasure, and repetitive use which can be used as intermediate image holding members, there have been proposed photochromic substance, thermotropic substance, magnetic recording substance and a liquid crystal sandwiched between glasses, etc.

The use of a photochromic substance as an intermediate image holding member involves the use of light as means for recording and erasure of such a photochromic substance and requires the photo-illumination onto a photochromic layer for optical recording thereon, so that the photochromic layer is liable to be denaturated and involves a problem in durability.

As a thermochromic substance, there has been reported thermo-reversible $Ag_2HgI_4$. However, this type of material lacks a memory characteristic, so that a heater is required to be always energized in order to hold an image. As a result, not only a large and complicated apparatus is required, but also a large electric power consumption is involved.

Further, the use of a liquid crystal light valve generally involves the use of a cell structure composed ordinarily of a low-molecular weight smectic liquid crystal and a laser absorption layer, etc., sandwiched between glass substrates. The liquid crystal in the homeotropic alignment state is thermally diffused into a scattering state by laser irradiation from the exterior. Because of such a structure, the formation of a large area device is difficult, and the erasure by electric field orientation results in a complicated structure of intermediate image holding member. Further, direct heat-writing by using a thermal head, etc., is difficult because of the device structure. Because a large area of device cannot be provided, enlarged projection is effected by using a high luminance light source, but an intermediate image is liable to be deteriorated by illumination light because of low thermal stability.

SUMMARY OF THE INVENTION

In view of the above, an object of the present invention is to provide an optical image recording apparatus which uses an image holding member having a memory characteristic and capable of clearly recording data at a high contrast and is capable of optionally recording data optically on a subsequent image holding member.

According to the present invention, there is provided an optical image recording apparatus, including:

an image holding member comprising a polymer recording layer capable of recording and holding data through heat application, thermal recording means for applying heat to the polymer recording layer, a photosensitive member, and exposure means for recording the data recorded by the recording layer on the photosensitive member.

According to another aspect of the present invention, there is provided an optical image recording apparatus, including:

an image holding member comprising an electroconductive substrate laminated at least with a photoconductive member and a polymer recording layer capable of recording and holding data through heat application, thermal recording means for applying heat to the polymer recording layer to form a pattern comprising a transparent portion and an opaque portion, and electrical imaging means for forming an electric charge distribution image on the polymer recording layer.

These and other objects, features and advantages of the present invention will become more apparent upon a consideration of the following description of the preferred embodiments of the present invention taken in conjunction with the accompanying drawings, wherein like parts are denoted by like reference numerals.

BRIEF DESCRIPTION OF THE DRAWINGS

FIG. 1 is a diagram showing a relationship between the temperature and transmittance (scattering intensity);

FIG. 2 is an illustration of a first apparatus embodiment, FIGS. 3A (3AA and 3AB)–3F (3FA and 3FB) are schematic sectional views illustrating image recording steps according to the first embodiment;

FIGS. 12A and 12B illustrate an apparatus used in a ninth embodiment;

FIGS. 13 and 14A-14J are views for a twelfth embodiment; and

FIG. 15 is a view for explaining a fourteenth embodiment.

DESCRIPTION OF THE PREFERRED EMBODIMENTS

Figure 4:
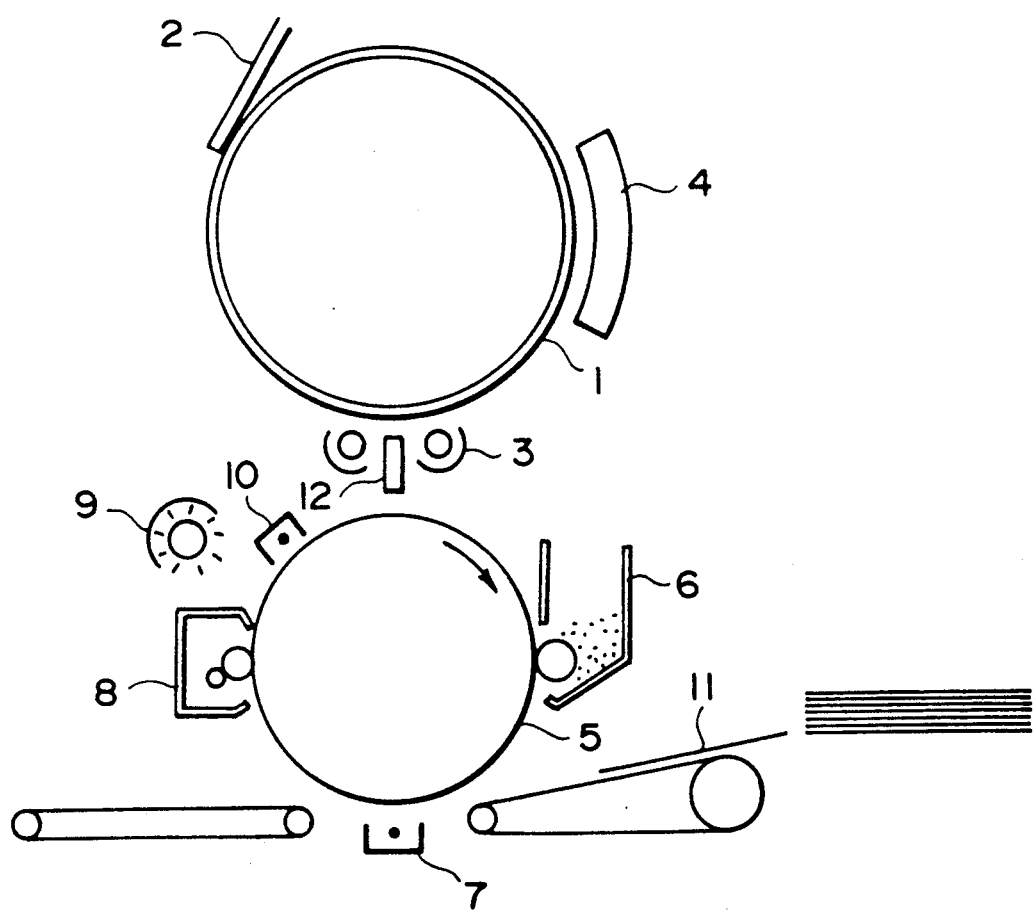
FIG. 4 is an illustration of a first apparatus embodiment, FIGS. 5A (5AA and 5AB)–5F (5FA and 5FB) are schematic sectional views illustrating image recording steps according to the first embodiment.

The image holding member the present invention may suitably comprise a polymer, particularly a thermotropic polymer liquid crystal. Examples thereof may include a side chain-type polymer liquid crystal which comprises a main chain of a methacrylic acid polymer, a siloxane polymer, etc., and a mesogen or low-molecular weight liquid crystal unit in side chains thereof like pendants; and also a main chain-type comprising a mesogen unit in its main chain, such as those of the polyester-type or polyamide-type, as used in the field of high-strength and high-modulus, heat-resistant fiber or resin.

These polymer liquid crystal may assume smectic phase, nematic phase, cholesteric phase or another phase or can also be a discotic liquid crystal.

Another class of polymer liquid crystals suitably used in the present invention may include a polymer liquid crystal showing ferroelectricity by introducing an asymmetric carbon atom to assume SmC* (chiral smectic C) phase.

Specific examples of the polymer liquid crystal used in the present invention are enumerated hereinbelow while other polymer liquid crystals can also be used in the present invention.

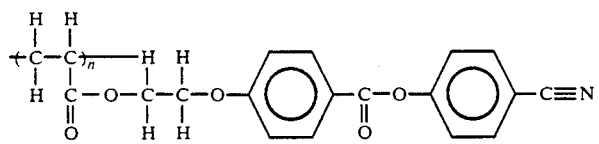
(I)

$\overline{M}w = 18,000$

Glass $\xrightarrow{75° C.}$ Liquid crystal phase (N) $\xrightarrow{110° C.}$ Iso.

N: nematic phase

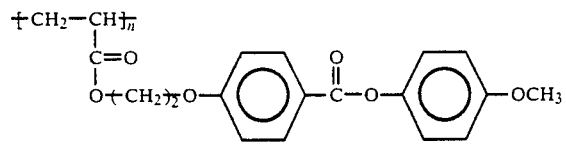
(II)

Glass $\xrightarrow{47° C.}$ Liquid crystal phase (N) $\xrightarrow{77° C.}$ Iso.

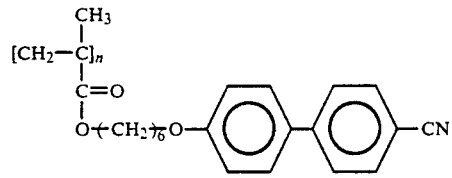
(III)

Glass $\xrightarrow{50° C.}$ Liquid crystal phase (Sm) $\xrightarrow{100° C.}$ Iso.

Sm: smectic phase

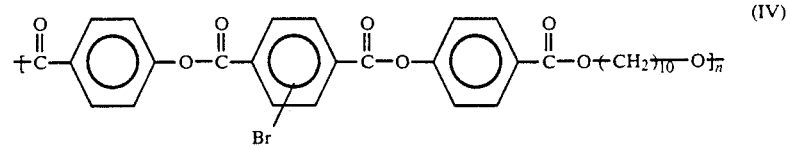
(IV)

Glass $\xrightarrow{140° C.}$ Liquid crystal phase (Sm) $\xrightarrow{196° C.}$ Iso.

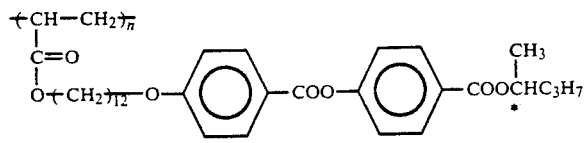

(V)

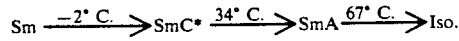

SmC*: chiral smectic C phase,

SmA: smectic A phase

These polymer liquid crystals have advantageous features such that it is readily formed in a large area dn has a memory characteristic. The above polymer liquid crystals may be used singly or in combination of two or more species.

In order to form a layer, a polymer liquid crystal may be dissolved in a solvent to form a solution for application. Examples of the solvent used for this purpose may include: dichloroethane, dimethylformamide (DMF), chclohexane, tetrahydrofuran (THF), acetone, ethanol, and other polar or non-polar solvents and mixtues of these. Needless to say, these solvents may be selected based on consideration of such factors as dissolving power of the polymer liquid crystal used, and the material of or wettability of the substrate or surface layer formed thereon to be coated thereby.

A recording layer used in the present invention and a function thereof will now be explained based on a specific example wherein a polymer liquid crystal of the above formula (I) was used.

The above polymer liquid crystal was dissolved in dichloroethane at a concentration of 20 wt. % and the solution was applied by an applicator on a polyester transparent substrate washed with alcohol, followed by standing at 90° C. for 10 minutes to form a white scattering fill in a thickness of 10 microns or slightly thicker.

The thus obtained while sheet was scanned in a pattern of character or figure by a thermal head, whereby a white pattern corresponding to the scanned pattern was fixed. When the sheet was placed on a backing member having an optical density of 1.2, a clear black display was obtained against the white background.

Then, the whole are of the above sheet having the above-mentioned pattern was heated to about 120° C. and then heated at about 90° C. for several seconds, whereby the original white scattering state was restored on the whole area and stably retained even if cooled to room temperature as it was, so that additional recording and display were possible.

The above series of phenomena can be controlled based on the fact that the above-mentioned polymer liquid crystal can assume at least three states including a film state below the glass transition point where it retains a stable memory state, a liquid crystal state where it can be transformed into a substantially optical scattering state and an isotropic film state at a higher temperature where it assumes an isotropic molecular alignment.

Now, the principle process of image formation by using an intermediate image holding member comprising a polymer liquid crystal layer formed on a transparent substrate is explained with reference to FIG. 1, which shows changes in transmittance or scattering intensity of a polymer liquid crystal layer versus temperature.

Referring to FIG. 1, the above-mentioned scattering state corresponds to a state ①. When the polymer liquid crystal layer in the state ① is heated by a heating means, such as a thermal head or laser light, to a temperature above $T_2$ (Tiso=isotropic state trnsition temperature) along a path denoted by ①a and then rapidly cooled, a light-transmissive state as shown by ③ similar to the isotropic state is fixed. Herein, "rapid cooling" means cooling at a rate sufficiently large as to fix the state before the cooling without substantial growth of an intermediate state, such as a lower-temperature liquid crystal phase. Such a rapid cooling condition can be realized without a particular cooling means and by having the recording medium stand in air for natural cooling. The thus-fixed isotropic state is stable at a temperature below $T_1$ (Tg: glass transition point), such as room temperature or natural temperature, and is stably used as an image memory.

On the other hand, if the polymer liquid crystal layer heated to above $T_2$ is held at a liquid crystal temperature between $T_1$ and $T_2$ for a period of, e.g., 1 second to several seconds, the polymer liquid crystal layer increases the scattering intensity during the holding period as indicated by a curve ①b to be restored to the original scattering state ① at room temperature. The resultant state is stably retained at a temperature below $T_1$.

Further, if the polymer liquid crystal layer is cooled while taking a liquid crystal temperature between $T_1-T_2$ for a period of, e.g., about 10 milliseconds to 1 second as indicated by curves ②, an intermediate transmissive state is obtained at room temperature, thus providing a gradation.

Thus, in this embodiment, the resultant transmittance or scattering intensity may be controlled by controlling the holding period at a liquid crystal temperature after heating into an isotropic state and until cooling to room temperature. The resultant state may be stably retained below $T_1$. Further, the velocity of restoring to the original scattering state is larger at a temperature closer to $T_2$ in the liquid crystal temperature range. If the medium is held at a temperature within the liquid crystal temperature range for a relatively long period, the scattering state ① can be restored without heating once into isotropic phase or regardless of the previous state.

The image or data formed on the intermediate image holding member may be transferred to a photosensitive member according to an optical image recording apparatus. Suitable examples of such a photosensitive member may include the following:

(1) A photosensitive member for electrophotography, (2) A diazo photosensitive member, (3) A silver salt photosensitive member (4) A capsule sheet-type photosensitive member formed by application of microcapsules enclosing a photosetting resin and a leuco dye as represented by one disclosed by Japanese Laid-Open Patent Application JP-A 59-30537.

(5) A photoresist, (6) A photosensitive member comprising a photothermally reactive material which abruptly reacts to irreversibly change its transfer characteristic and utilizing a change in the characteristic depending on image signals for image formation ( JP-A 62-174195, etc.)

Hereinbelow, the image recording apparatus according to the present invention in which a recording layer having the above-mentioned function and characteristic is used as an intermediate image holding member, will be explained with reference to embodiments, in some of which the recording layer is disposed together with a photoconductive layer on an electroconductive substrate.

First embodiment

In this embodiment, a polymer liquid crystal is used to constitute an intermediate image holding member used in an electrophotographic image forming process In this embodiment, a fine image is first read by an optical scanner driven at a low speed, the thus-read image data as they are or once stored in a memory are used to thermally form an intermediate image on a polymer liquid crystal layer, and then recording on a plurality of sheets is performed at a high speed without using a precision optical system including a laser and a polygonal mirror.

Hereinbelow, the embodiment is explained with reference to FIG. 2 showing an apparatus therefor and FIGS. 3A (3AA and 3AB) through 3F (3FA and 3FB) showing respective steps corresponding to parts denoted by (a) to (f) (=(a)) in FIG. 2.

Referring to the Figures, the apparatus includes an intermediate image holding member comprising a transparent cylinder $1a$ of plastic, etc., the surface of which is coated with a polymer liquid crystal layer $1b$. The polymer liquid crystal layer $1b$ has been formed by application of a 20 wt.% dichloroethane solution of the above-mentioned polymer liquid crystal of the formula (I) by dipping (or coating) and left to stand for 10 minutes in an oven at 95° C. to be converted into a white scattering layer. The intermediate image holding member 1 is rotated in the direction of an arrow by a motor (not shown) in synchronism with an electrophotographic system (according to an ordinary Carlson process) shown at the lower part of FIG. 2.

Further, an apparatus for uniform heating and gradual cooling 4 comprises a halogen heater $4a$ held at about 120° C. and a planar heater $4b$ held at about 80° C. respectively facing the image holding member 1. While being driven in rotation, the polymer liquid crystal layer $1b$ is heated at 115° C. by the halogen heater $4a$ to be substantially transparent as a whole and than passed by the planar heater in a length of 50 mm to be scattered as a whole, thus being erased.

Then, the polymer liquid crystal layer $1b$ is heated by contact with a thermal head 2 for image recording. In this instance, it is possible to improve the durability by laminating the polymer liquid crystal layer $1b$ with a protective layer of polyimide, aramide, etc. Then, the polymer liquid crystal layer $1b$ is caused to face an electrophotographic photosensitive member 5 having a surface layer comprising an organic photosensitive material and rotating at the same circumferential speed as the image holding member 1.

Then, the image forming process is explained with reference to FIG. 2 and FIGS. 3A-3F.

(a) Initial state

The polymer liquid crystal $1b$ is in a scattering state (FIG. 3AA). The photosensitive member 5 is in a non-charged state (FIG. 3AB).

(b) The polymer liquid crystal layer $1b$ is heated locally ((A) parts), i.e., imagewise, by the thermal head 2 depending on given image data, and the heated (recorded) portions of the polymer liquid crystal layer $1b$ assumes an isotropic transparent state (FIG. 3BA). On the other hand, the photosensitive member 5 is subjected to primary charging, i.e., uniformly charged positive (or negative according to a process used) by a corona charger 10.

(c) The polymer liquid crystal layer $1b$ is exposed by a whole area exposure apparatus 3, and light is transmitted through the recorded image portions (A) to locally or imagewise illuminate the photosensitive member 5 to locally extinguish the charge on the photosensitive member 5. On the other hand, at the nonrecorded portions (B) of the polymer liquid crystal layer, light is scattered to leave the photosensitive member 5 unexposed and leave the charged state (FIG. 3C).

(d) The image holding member 1 is separated from the photosensitive member 5 (FIG. 3DA). The photosensitive member 5 is subjected to development by a developer 6 whereby a toner is selectively attached to the charged parts (FIG. 3DB).

(e) The toner on the photosensitive member 5 is transferred to a transfer-receiving medium 11 such as paper by the action of a transfer charger 7. Then, the toner image on the transfer-receiving member 11 is fixed by a fixing apparatus (not shown) (FIG. 3EB).

(f) The polymer liquid crystal layer $1b$ is uniformly heated and gradually cooled by an apparatus 4 to be wholly converted into a scattering state, i.e., the initial state (FIG. 3FA). The photosensitive member 5 is subjected to cleaning by a cleaner 8 for removing the toner remaining thereon and then is restored to the initial state by removal of the surface charge through whole area exposure by a whole area exposure apparatus 9.

In this way, the toner is attached to the parts of the transfer-receiving material corresponding to the parts of the polymer liquid crystal layer not subjected to heat application to form a negative image. In a particular embodiment, a clear image having a density of 1.1 was formed on a white transfer paper.

Second embodiment

This is a modification of the first embodiment wherein an intermediate image holding member comprising a polymer liquid crystal is used in a reflective mode. This embodiment is explained with reference to FIG. 4 showing an apparatus therefor and FIGS. 5A (3AA and 3AB) through 5F (5FA and 5FB) showing respective steps involved therein.

Referring to the figures, the apparatus includes an intermediate image holding member 1 comprising a cylindrical aluminum substrate $1a$, the outer surface of which has been coated with a black light-absorbing layer $1c$ and then a polymer liquid crystal layer $1b$ which is the same as the one used in the first embodiment.

The polymer liquid crystal layer $1b$ is rotatably disposed to face a selenium electrophotographic photosensitive layer 5 (e.g., for the Carlson process). The cylinders 1 and 5 are rotated in the direction of arrows at the same velocity.

This embodiment shown in FIG. 4 is different from the one shown in FIG. 2 in that the intermediate image holding member 1 is used in a reflective mode, photo-illumination is effected from outside by a whole-area exposure apparatus 3, and the reflected light image is guided to a photosensitive member 5 by the medium of a short-focus lens array 12.

Then, the image forming process is explained with reference to FIG. 4 and FIGS. 5A-5F.

(a) Initial state

The polymer liquid crystal 1b is in a scattering state (FIG. 5AA). The photosensitive member 5 is in a non-charged state (FIG. 5AB).

(b) The polymer liquid crystal layer 1b is heated locally ((A) parts), i.e., imagewise, by the thermal head 2 depending on prescribed image data, and the heated (recorded) portions of the polymer liquid crystal layer 1b assumes an isotropic transparent state (FIG. 5BA). On the other hand, the photosensitive member 5 is subjected to primary charging by a corona charger 10.

(c) The polymer liquid crystal layer 1b exposed by a whole area exposure apparatus 3, and light is transmitted through the recorded image portions (A) to be absorbed by the black layer 1c of the image holding member so that the light is not conveyed to the short-focus lens array 12, i.e., to the photosensitive member 5. Therefore, the charge on the photosensitive member is retained.

On the other hand, light incident on the non-recorded portion (B) is scattered thereby and a part of the scattered light is transmitted through the short-focus lens array 12 to reach the photosensitive member 5, thus locally exposing the photosensitive member 5 to extinguish the surface charge thereat (FIG. 5C).

(d) The image holding member 1 is separated from the photosensitive member 5 (FIG. 5DA). The photosensitive member 5 is subjected to development by a developer 6 whereby a toner is selectively attached to the charged parts (FIG. 5DB).

(e) The toner on the photosensitive member 5 is transferred to a transfer-receiving medium such as paper by the action of a transfer charger 7. Then, the toner image on the transfer-receiving member 11 is fixed by a fixing apparatus (not shown) (FIG. 5EB).

(f) The polymer liquid crystal layer 1b is uniformly heated and gradually cooled by an apparatus 4 to be wholly converted into a scattering state, i.e., the initial state (FIG. 5FA). The photosensitive member 5 is subjected to cleaning by a cleaner 8 for removing the toner remaining thereon and then is restored to the initial state by removal of the surface charge through whole area exposure by a whole area exposure apparatus 10.

In this way, the toner is attached to the parts of the transfer-receiving material corresponding to the parts of the polymer liquid crystal layer subjected to heat application to form a positive image. In a particular embodiment, a clear image having a density of 1.0 was formed on a white transfer paper.

In the above embodiment, the image holding member 1 has three layers of the substrate 1a, the light-absorbing layer 1c and the polymer liquid crystal layer 1b. It is however possible that the image holding member comprises two layers of a transparent substrate 1a and a polymer liquid crystal layer 1b or of a total reflection substrate 1a and a polymer liquid crystal layer 1b.

Third embodiment

In this embodiment, an infrared (semiconductor) laser is used for thermal recording.

Figure 6A:
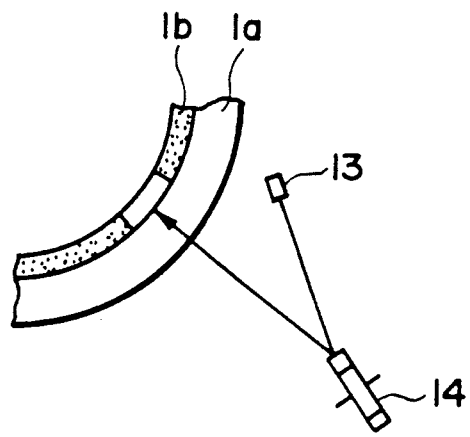
FIGS. 6A and 6B respectively illustrate an embodiment wherein an infrared laser is used as a thermal recording means.

FIG. 6A shows a modification of the first embodiment which is different from the first embodiment in that an intermediate image holding member having a different layer structure is used and an infrared laser as a thermal recording means is used by the medium of a polygonal mirror 14 for scanning from the exterior for recording.

The intermediate image holder member 1 comprises a transparent substrate layer 1a and a polymer liquid crystal layer 1b.

In a particular example, the polymer liquid crystal used in the first embodiment was dissolved in solvent cyclohexane and in infrared-absorbing dye of the formula:

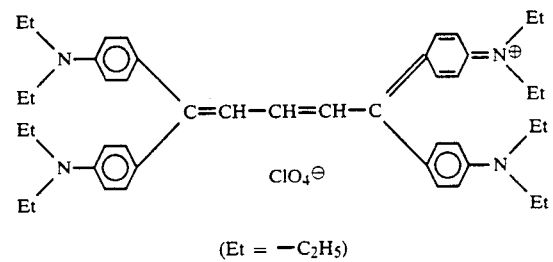

$(Et = -C_2H_5)$ was added thereto so as to provide weight ratios of polymer liquid crystal/laser-absorbing dye/solvent =20/1/100. The resultant solution was applied on the inner face of the substrate 1 by dipping to form an about 8 micron-thick polymer liquid crystal layer 1b.

Figure 6B:
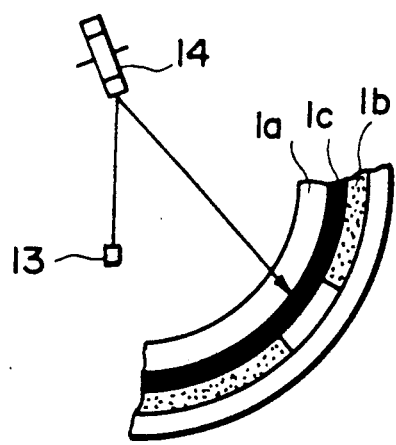

On the other hand, FIG. 6B shows a modification of the second embodiment which is different from the latter in that a light-absorbing layer 1C containing an infrared-absorbing dye is used in combination with an infrared laser 14, recording is effected from inside the image holding member for providing a compact apparatus, and a polymer liquid crystal layer is removably applied on a separate film so as to allow its exchange.

According to the above embodiments, beautiful electrophotographic images were obtained respectively.

More specifically, in the case of FIG. 6A, an image similar to the one obtained in the first embodiment was obtained. In the case of FIG. 6B, a higher contrast image having a concentration of 1.2 was obtained as compared with the one obtained in the second embodiment an air layer was present between the polymer liquid crystal layer and the light-absorbing layer.

Fourth embodiment

Figure 7:
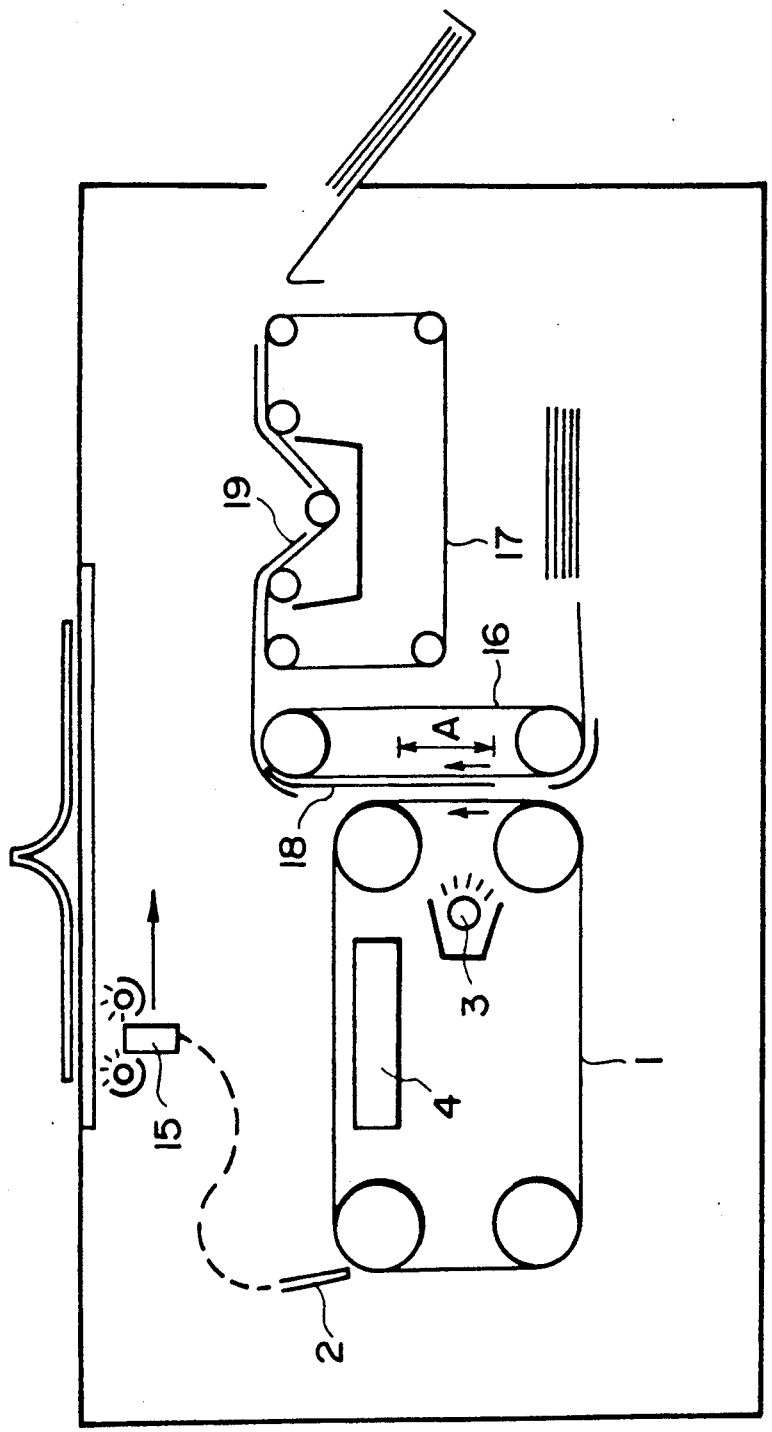
FIG. 7 is an illustration of a fourth apparatus embodiment.

FIG. 7 illustrates an embodiment wherein an intermediate image holding member comprising a polymer liquid crystal is applied to an image forming process using a diazo photosensitive material.

According to this embodiment, it is possible to form a copy from a solid object such as a book in an image forming process using a diazo photosensitive material.

In this embodiment, an intermediate image holding member 1, thermal head and a uniform heating apparatus for gradual cooling are similar to those used in the first embodiment, but an ultraviolet light generator is used as an illumination apparatus 3. The illumination can be effected so as to expose an A4 size by one-shot flush exposure or slit exposure.

The intermediate image holding member 1 and conveyer belts 16, 17 are synchronously driven respectively in the direction of an arrow by a driving apparatus (not shown).

Data are recorded on the intermediate image holding member 1 by a thermal head 2 to which the data are supplied from an optical scanner 15 for readily an original, and the image holding member 1 is placed in intimate contact at a part A with a diazo photosensitive sheet 18 conveyed by the belt 16 and exposed from the illumination apparatus 3.

The diazo photosensitive sheet 18 may be an ordinary commercially available one. In a particular embodiment, a sheet coated with a mixture of a diazonium salt and a coupler was used, whereby an image with a high contact was obtained.

Fifth embodiment

Figure 8A:
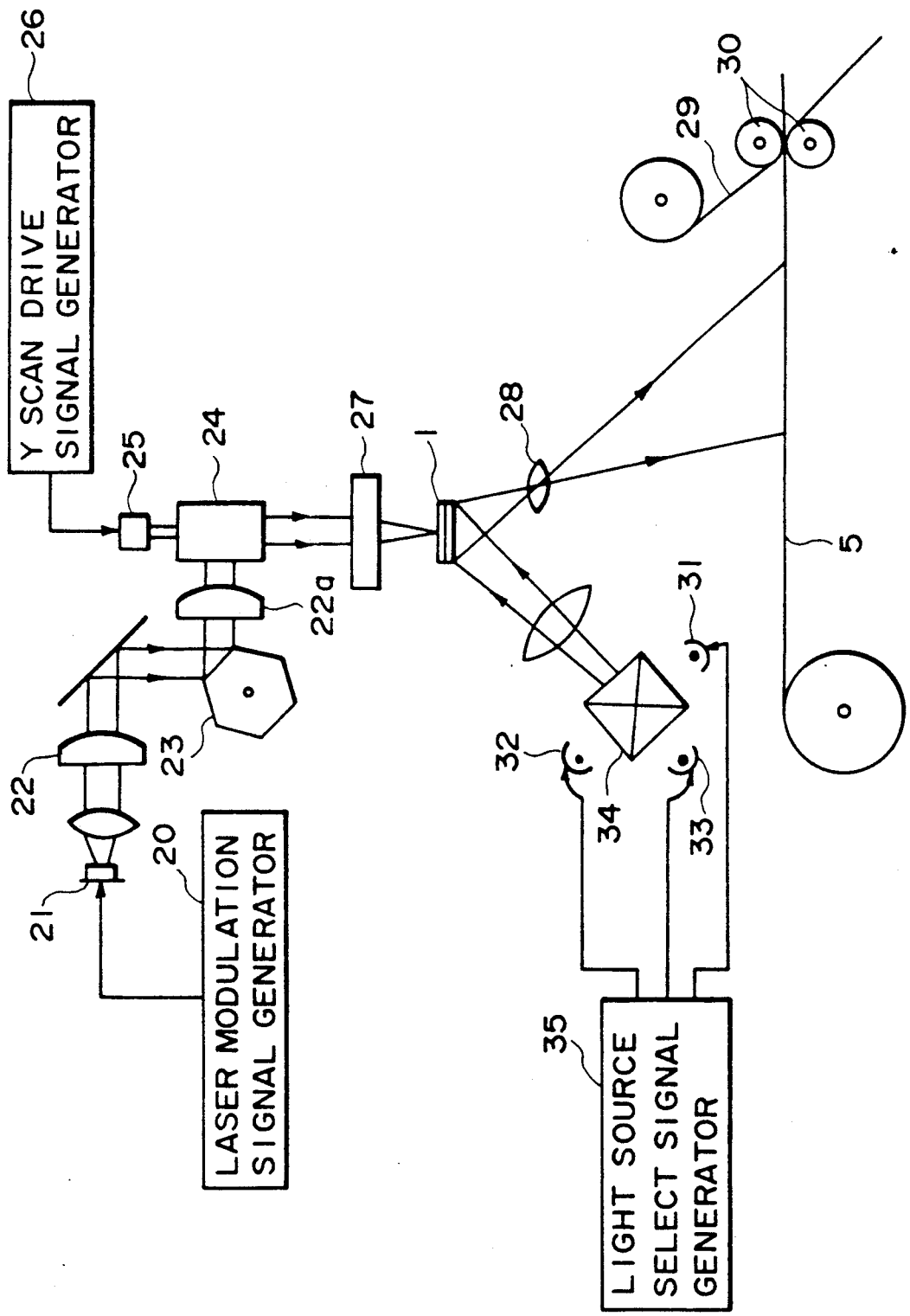
FIGS. 8A and 8B illustrate a fifth apparatus embodiment wherein intermediate images corresponding to R, G and B for color image recording are formed by sequential exposure.

FIG. 8A shows an embodiment wherein an intermediate image holding member is applied to an image forming system as representatively disclosed by Japanese Laid-Open Patent Application JP-A 59-30537 wherein a capsule sheet coated with microcapsules containing a photosetting resin and a leuco dye is exposed to selectively harden microcapsules, followed by destruction of microcapsules under application of pressure etc., to form an image on a resin-coated receiver sheet.

The system shown in FIG. 8A includes a laser modulation signal generator 20, a semiconductor laser 21, f-θ lenses 22 and 22a, an X-axis scanning mirror 23, a Y-axis scanning mirror 24, a Y-axis scanning lens drive 25, a Y-axis scanning drive signal generator 26, an objective lens 27, a projection lens 28, a receiver sheet 29, a pressure transfer unit 30, a B(blue)-light source unit 31, an R(red)-light source unit 32, a G(green)-light source unit 33, a dichroic prism 34, and a light source selection signal generator 35.

In this embodiment, the semiconductor laser 21 is modulated, and a polygonal mirror 23 and a galvano mirror 24 are used to write intermediate images corresponding to R, G and B on an image holding member 1. Then, the intermediate images on the image holding member 1 are successively exposed to R-wavelength, G-wavelength and B-wavelength from the respective light source units 31-33 through the dichroic prism 34 to project the respective images onto a photosensitive sheet 5 through the projection lens 28. The exposed photosensitive sheet 5 is superposed on a receiver sheet 29 and passed through the pressure transfer unit to form an image on the receiver sheet 29.

Figure 8B:
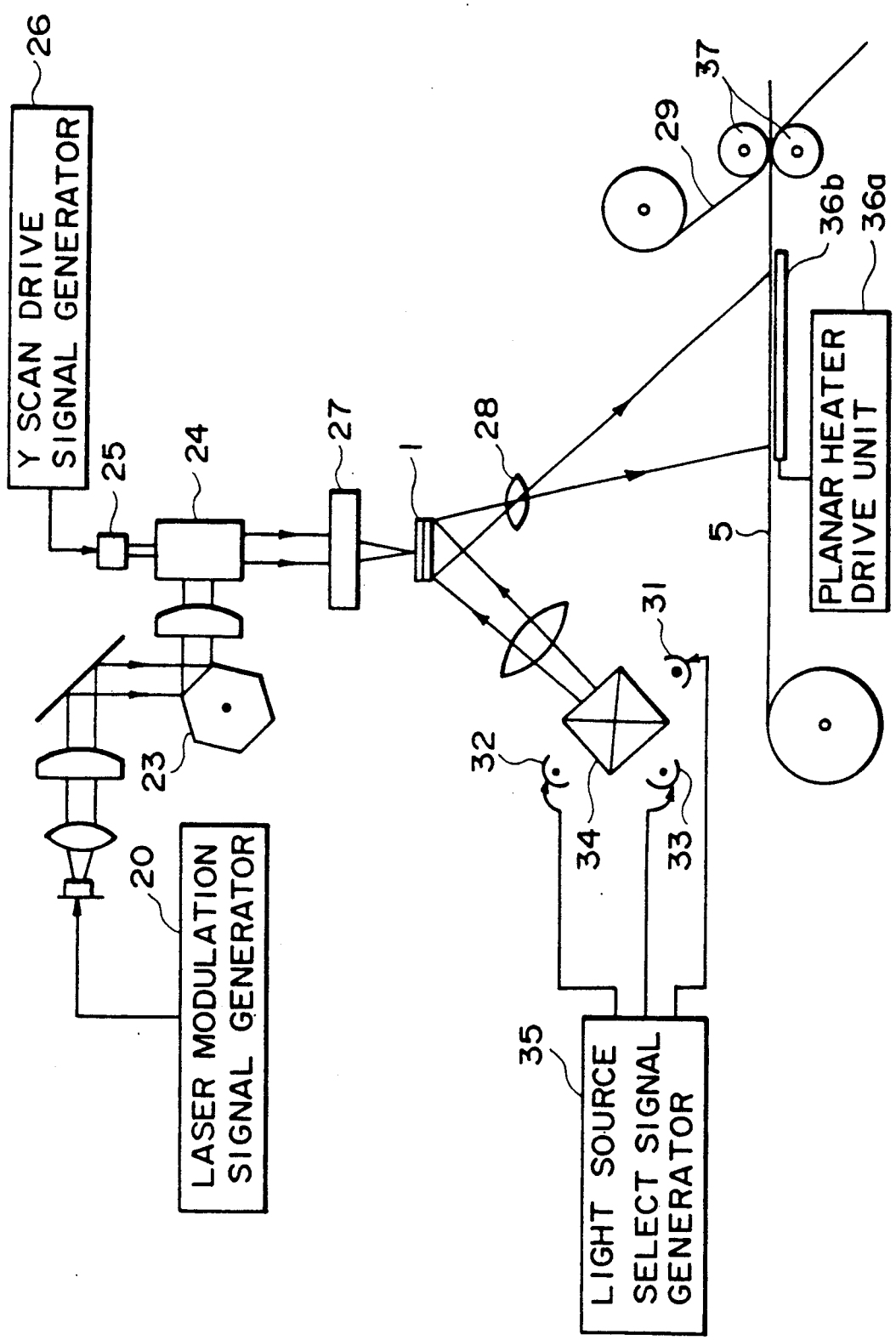

FIG. 8B shows an embodiment wherein an intermediate image holding member is applied to an image forming system as representatively disclosed by Japanese Laid-Open Patent Application JP-A 62-174195 wherein a capsule sheet coated with microcapsules containing a photo-thermosetting resin and a dye is exposed to selectively harden microcapsuoes, followed by destruction of microcapsules, under application of heat and pressure, to form an image on a receiver sheet.

In the system shown in FIG. 8B, the members denoted by reference numerals 20-35 are the same as those used in the system shown in FIG. 8A. The system shown in FIG. 8B further includes a planar heater drive unit 36a, a planar heater 36b and a pressure and heat transfer unit 37.

In the system shown in FIG. 8B, the writing of intermediate images and light illumination from the respective light sources are performed similarly as in FIG. 8A. Further, the photosensitive sheet 5 is heated by the planar heater 36b in synchronism with the exposure to R-wavelength, G-wavelength and B-wavelength respectively to project the intermediate images formed on the image holding member 1 onto the heated portion of the photosensitive sheet 5. The exposed photosensitive sheet 5 is superposed on a receiver sheet 29 and passed thought the pressure and heat transfer unit 37 to form an image on the receiver sheet 29.

Sixth embodiment

Figure 9A:
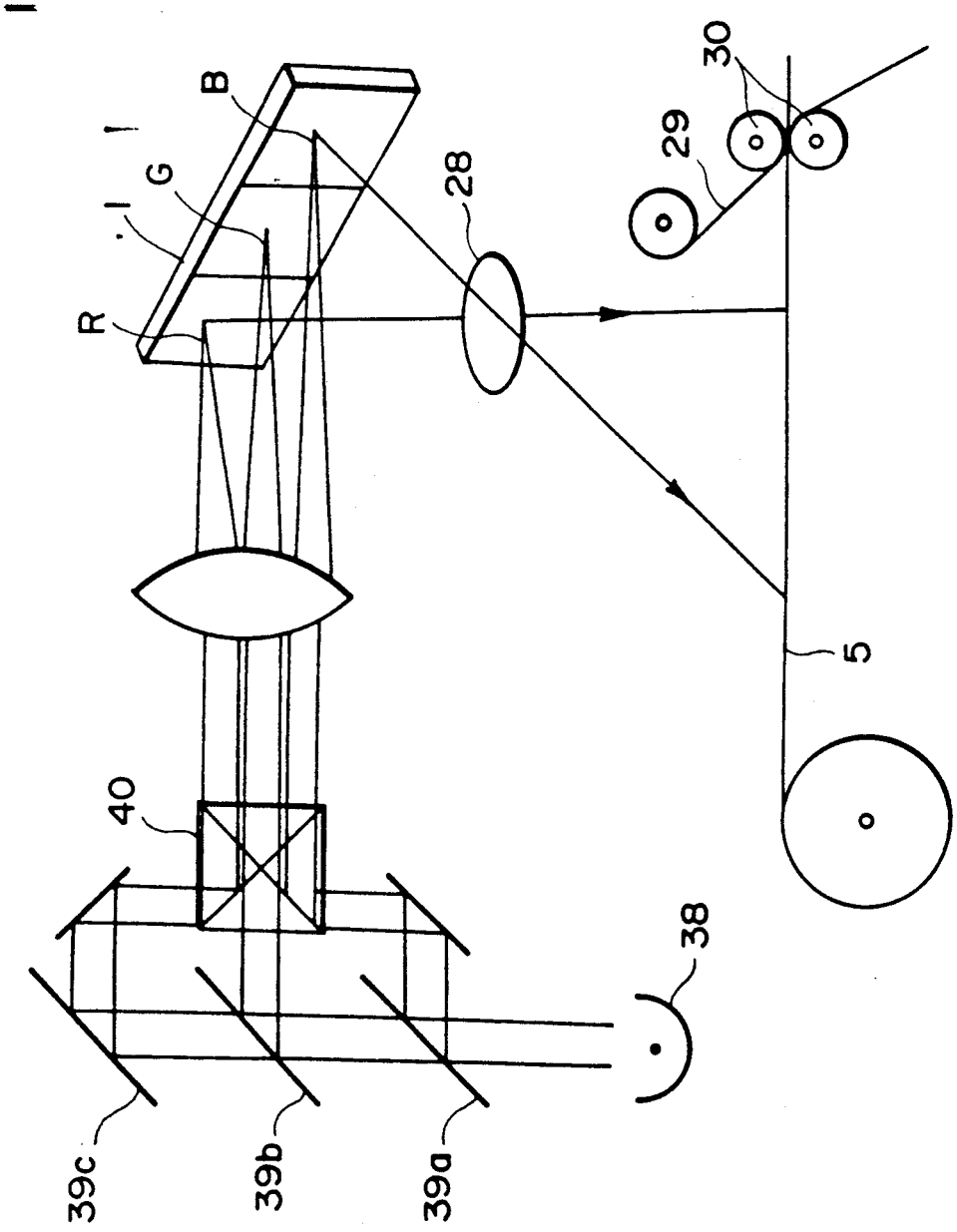
FIGS. 9A and 9B illustrate a sixth apparatus embodiment wherein intermediate image corresponding to R, G and B are formed by one-shot exposure.
Figure 9B:
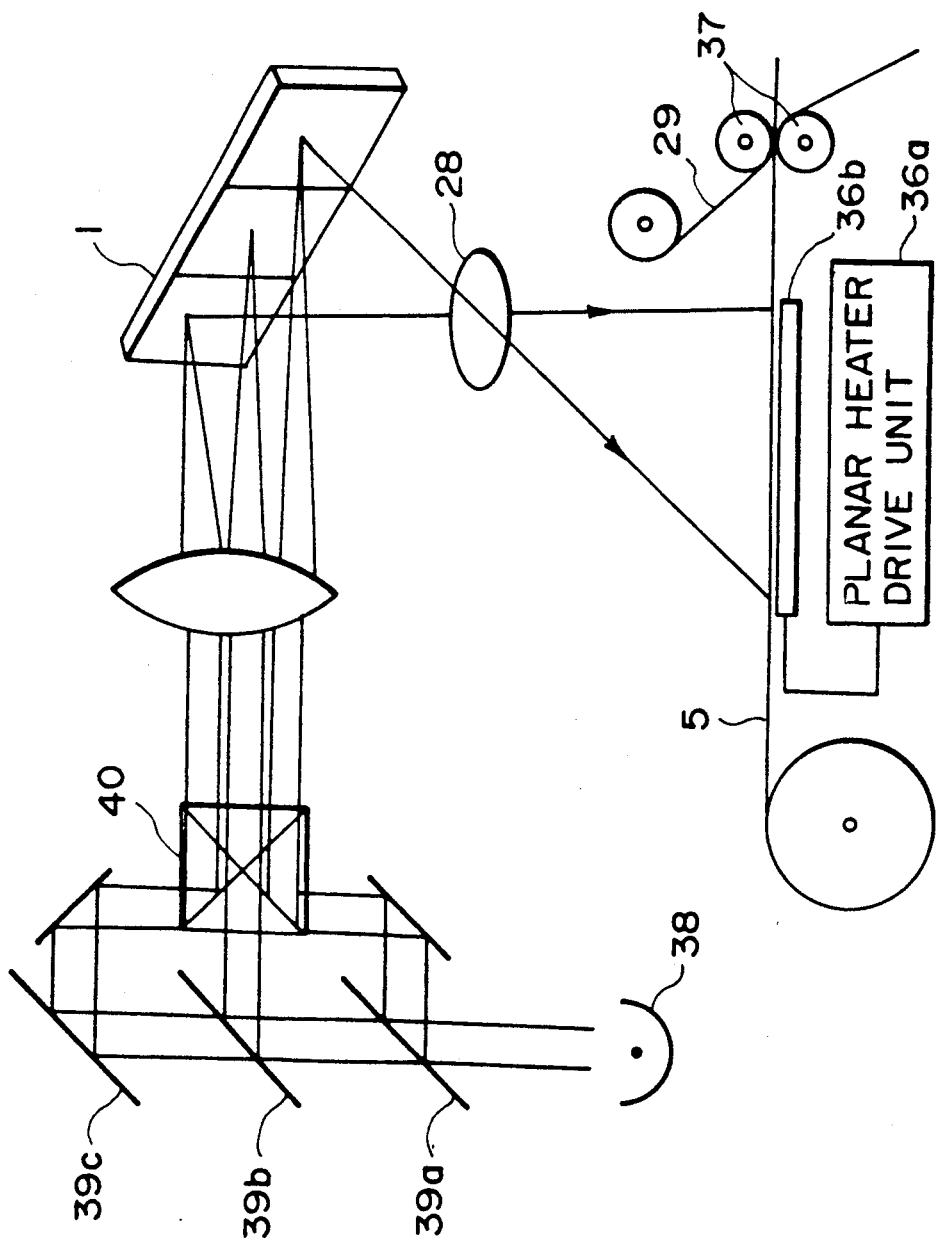

FIGS. 9A and 9B show modifications of the systems shown in FIGS. 8A and 8B of the fifth embodiment wherien the photosensitive member 5 is exposed to R-, G- and B-wavelengths simultaneously.

In FIGS. 9A and 9B, the member denoted by reference numerals 1, 5, 28, 29, 30, 36a, 36b and 37 are the same as those shown in FIGS. 8A and 8B. The systems shown in FIGS. 9A and 9B respectively further include a light source unit 38, dichroic mirrors 39a, 39b and 39c, and a dichroic prims 40.

Seventh embodiment

Figure 10:
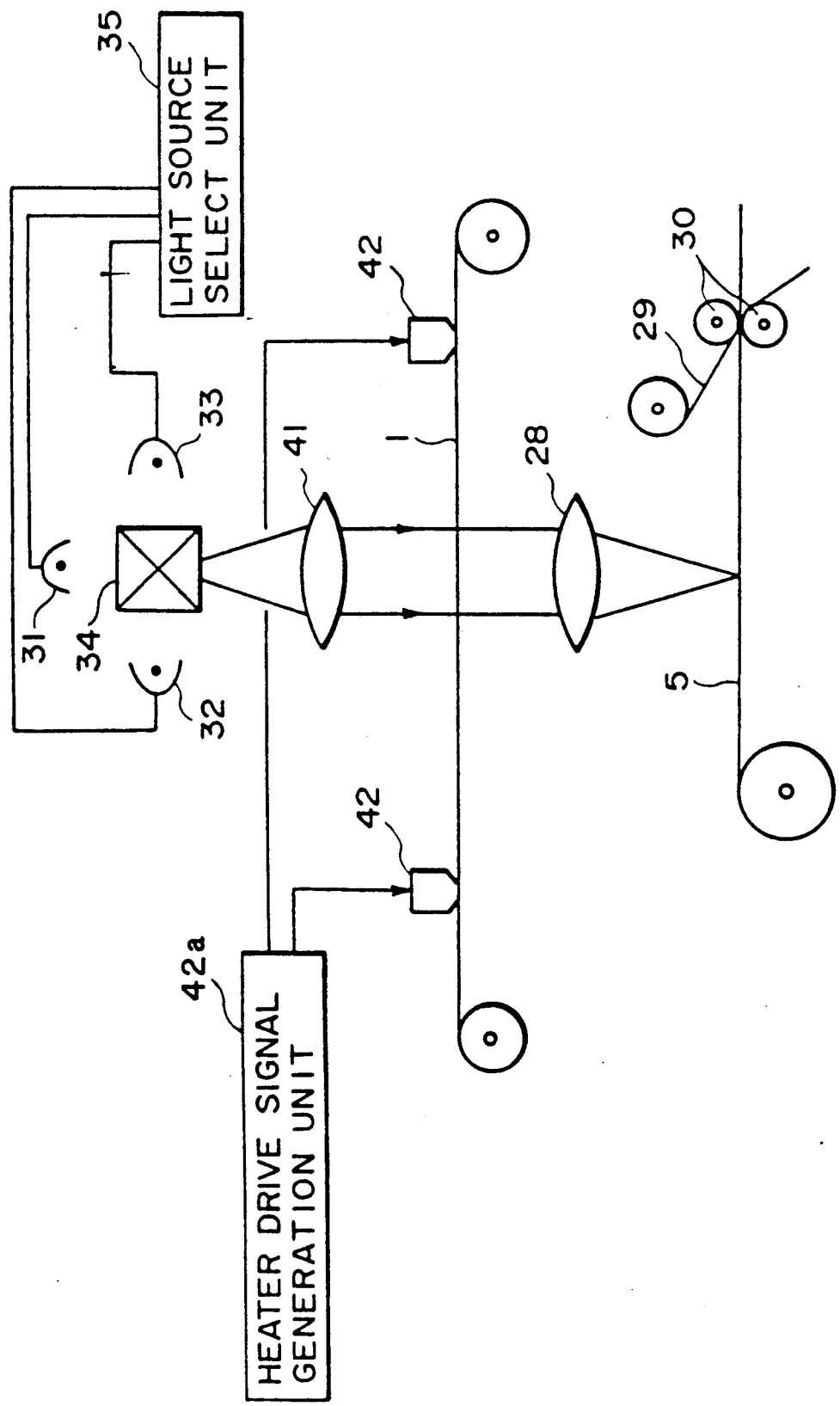
FIG. 10 illustrates a seventh apparatus embodiment.

FIG. 10 shows an embodiment wherein an intermediate image is formed on an image holding member as described above by an imagewise heating unit 42 driven by a heater drive signal generating unit 42a, and the intermediate image is sequentially exposed to light rays from R-, G- and B-light sources. The resultant light image is transmitted through the image holding member 1 by using a transmission-type optical system including Schlieren lens 41 and a projection lens 28. The members 1, 5, 28-35 are the same as described above. In a particular embodiment using the same photosensitive sheet 54 as used in the fifth embodiment, a high contrast transfer image was obtained.

Eighth embodiment

Figure 11A:
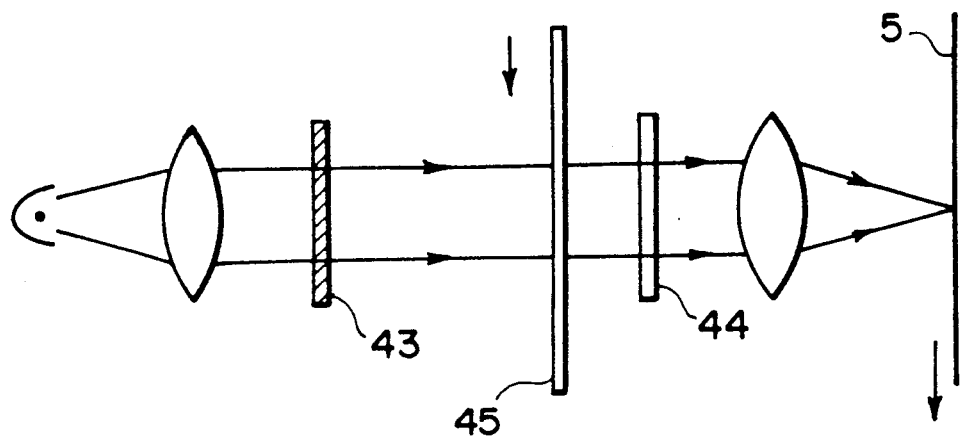
FIGS. 11A and 11B illustrate an apparatus for improving an image contrast by using a polarizer and an analyzer.
Figure 11B:
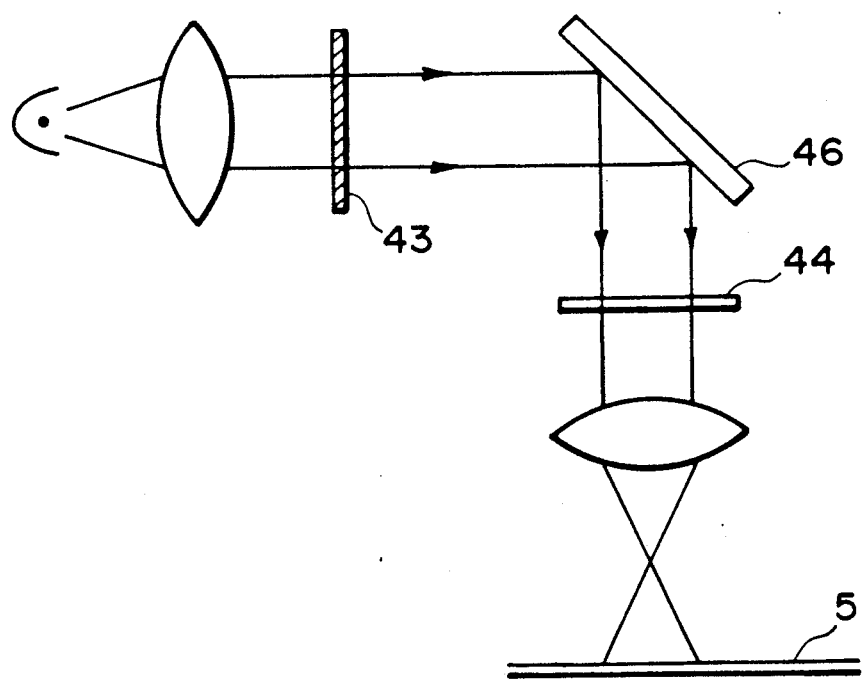

FIGS. 11A and 11B show embodiments wherein a polarizer 43 and an analyzer 44 are combined with a projection optical system. FIG. 11A shows an embodiment of using a transmission-type image holding member 45, and FIG. 11B shows an embodiment of using a reflection-type image holding member 46. In these embodiments images formed on the photosensitive sheets 5 could have a higher contrast than those obtained in the seventh and fifth embodiments.

Ninth embodiment

FIGS. 12A and 12B respectively show a projection apparatus for projecting an image on an intermediate image holding member onto a photosensitive sheet. FIG. 12A shows an embodiment of using a transmission-type image holding member 45, and FIG. 12B shows an embodiment of using a reflection-type image holding member 46. The systems shown in FIGS. 12A and 12B include a Schlieren lens 47, a mask 48, a light source 49 and a projection lens 50. In these embodiments, images formed on the photosensitive sheet 5, showed a higher contrast than those obtained in the above-mentioned seventh and fifth embodiments.

By using a polarizer and an analyzer in the above Schlieren optical system, a higher contrast can be obtained.

| Tenth embodiment | |
|---|---|
| Heat-diffusive dye (Oplas Red 330, available from Orient Kagaku K.K.) | 1.8 part (weight) |
| Methyl methacrylate/butyl methacrylate copolymer | 1.0 part |
| Methyl ethyl ketone | 10 parts |
| 3,3'-Carbonylbis(7-methoxycoumarin) | 0.16 part |
| Ethyl p-dimethylaminobenzoate | 0.04 part |
| Pentaerythritol tetraacrylate | 2.0 parts |

The above ingredients were respectively weighed and mixed by using a paint shaker to form a coating liquid.

A 6 micron-thick polyester film was coated with the above coating liquid by means of an applicator and dried to form a 2 micron-thick polymer layer, which was further coated with a 3 micron-thick polyvinyl alcohol (PVA) layer to provide an image forming medium.

The thus-formed image forming medium was superposed with an intermediate image holding member according to the invention having a recorded image, followed by exposure for 1 second to fluorescent light having a peak at 390 nm from a fluorescent lamp disposed 5 cm spaced apart from the recording medium.

Then, the intermediate image holding member was removed, and the image forming medium was passed through a thermal developing apparatus controlled at 110° C. for 8 seconds. Further, the image forming medium was placed on a hot plate heated at 60° C. and exposed for 60 seconds to fluorescent light having a peak at 390 nm from a fluorescent lamp disposed 5 cm spaced apart therefrom.

Then, the PVA film was removed and the remaining image-forming medium was superposed on an image-receiving layer comprising a polyester resin formed on a synthetic paper, so that the polymer layer contacted the image receiving layer. The superposed structure was heated at 120° C. for 10 seconds from the side of the image forming medium, whereby the dye was transferred by diffusion from the polymer layer to the image-receiving layer to form a clear red dye image on the image-receiving layer. The above treatments were all performed in a darkroom.

Eleventh embodiment

Into 10 parts of methyl ethyl ketone, 1.0 part of polymethyl methacrylate, 2.0 parts of Unidic 16-824 (mfd. by Dainippon Ink K.K.), 0.2 part of camphorquinone, and 0.2 part of Foron Brilliant Scarlet SRG (mfd. by Sandoz, Ltd.) were added, and dispersed by a paint shaker to obtain a coating emulsion.

The above emulsion was applied by an applicator on an aluminum-deposited polyethylene terephthalate film (mfd. by Panak Kogyo K.K.) to form a 2 micron-thick dry film, which was then laminated by a transparent polyethylene terephthalate film to form an image forming medium.

The thus-formed image forming medium was superposed with an intermediate image holding member according to the invention having a recorded image, followed by exposure for 10 second to fluorescent light having a peak at 390 nm from a 15 W-fluorescent lamp disposed 5 cm spaced apart from the image-forming medium.

Then, the intermediate image holding member was removed, and the image forming medium was controlled at 100° C.. Further, the image forming medium was placed on a hot plate heated at 60° C. and exposed for 20 seconds to fluorescent light having a peak at 380 nm from a 15 W-fluorescent lamp disposed 5 cm spaced apart therefrom.

Then, the medium was further passed through rollers heated to 60° C. and exerting a pressure of kg/cm$^2$, and the transparent polyethylene terephthalate film was peeled to leave a red negative image on the medium.

In the above-described embodiments, the recording on the polymer liquid crystal layer is effected by application of heat energy and the image transfer to the photosensitive layer is effected by application of light energy, so that a good repetition durability is provided. The inclusion of an ultraviolet absorber provides a further improved durability.

In addition to the above, it is possible to effect optical image transfer to other photosensitive media, such as silver salt, dry silver salt, and photopolymers inclusive of a photoresist. This is applicable to, e.g., preparation of a block copy.

Further, by using a polymer liquid crystal layer as a microfilm, it can be applied to formation of copies by electrophotography.

In the above embodiment, explanation has been made on a case where the recording means, erasure means, etc. for a polymer liquid crystal are incorporated in a single apparatus, but it is possible to combine these members into a cartridge or divide them into two units.

The recording onto a polymer liquid crystal has been explained to be effected by heat, but it is of course possible to apply heat and electric field in combination for such recording.

The data recorded on the polymer recording layer may be visible, so that it can be utilized as a display by direct observation or projection. Thus, it is possible to confirm the data before final image formation.

Twelfth embodiment

In this embodiment, a polymer liquid crystal medium is applied as an electric charge image holding member for electrophotographic image formation.

In this embodiment, a desired image is thermally recorded on a polymer liquid crystal layer based on image data from a memory or electric image signals obtained by reading of an original image by an optical scanner, and then the thus thermally recorded image as an intermediate image is subjected to uniform photo-illumination to output a plurality of sheets at a high speed.

This embodiment is explained with reference to FIG. 13 showing an apparatus therefor and FIGS. 14A through 14J.

Referring to these figures, an image holding member 1 comprises an electroconductive substrate 52, a photoconductive layer 53 and an electric charge holding layer 54 comprising a polymer liquid crystal as described above. In a particular embodiment, the polymer liquid crystal may be one of the following formula (II):

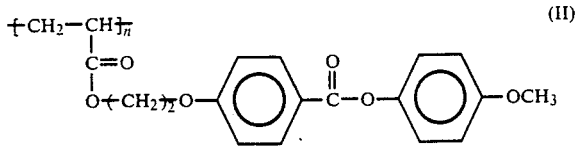

-continued

Glass $\xrightarrow{47° C.}$ Liquid crystal phase (N) $\xrightarrow{77° C.}$ Iso.

The structure of the image holding member 51 is explained in more detail.

The electroconductive substrate 51 may be one comprising a transparent substrate of plastic, glass, etc., coated with a transparent conductive layer of ITO (indium-tin-oxide), etc. The photoconductive layer may be provided by forming a layer of a photoconductive material such as CdS (cadmium sulfide), ZnO (zinc oxide) or various OPCs (organic photoconductors) in an appropriate thickness of, e.g., about 5 to 70 microns. A representative example may include an about 40 micron-thick layer of CdS sensitized with copper, indium, etc.

The image holding member 51 may be formed by applying a solution of the above-mentioned polymer liquid crystal in an appropriate solvent directly onto the above-mentioned photoconductive layer 53. It is however possible, as desired, to laminate an insulating film of, e.g., about 10 micron-thick polyethylene terephthalate film or provide an appropriate coating film on the photoconductive layer 53 and then to form thereon the polymer liquid crystal layer. More specifically, the polymer liquid crystal layer may for example be formed by dissolving the above polymer liquid crystal of the formula (II) in dichloroethane to form a 20% solution, and applying the solution onto the insulating layer or directly onto the photosensitive layer by dipping or another coating method, followed by standing for 5 minutes in an oven at 70° C. to form an about 15 micron-thick white scattering layer.

Hereinbelow, the image forming process is explained with reference to FIG. 13 and FIGS. 14A through 14H.

Initial state

The polymer liquid crystal layer 54 is a scattering state and the surface thereof is in a non-charged state (FIG. 14A).

Intermediate image recording

The polymer liquid crystal layer 54 is heated image-wise by a thermal head 58 based on prescribed image data, and the heated portions of the polymer liquid crystal layer assumes an isotropic transparent state (FIG. 14B).

Then, the image holding member 51 is subjected to a modification of the NP process, a class of electrophotographic process.

Image formation process

The surface of the polymer liquid crystal layer 54 is uniformly ⊕-charged (or possibly ⊖-charged depending on a photoconductive layer used) by a charger. At this time, ⊖ charges are injected from the electroconductive substrate 52 into the photoconductive layer 53 (FIG. 14C).

The image holding member 51 is subjected to AC discharge by a charger 55 while being exposed by an exposure lamp 56 from the polymer liquid crystal layer 54 side. As described above, an image has been formed in the polymer liquid crystal film 54 by a contrast between scattering portions-transparent portions, so that the photoconductive layer 53 is exposed to light transmitted through the transparent portions, so that the charges thereat are extinguished (FIG. 14D).

Then, the photoconductive layer 53 is subjected to whole area exposure by a lamp 57 from the transparent substrate side, whereby a surface potential image is formed by an electric charge distribution formed on the polymer liquid crystal layer 54 (FIG. 14E).

The surface potential image is developed with a toner to form a toner image by using a developing apparatus 59 according to known two-component development, jumping development, liquid development or other development methods (FIG. 14F). In the figure, the toner is shown to be attached to the scattering portions of the polymer liquid crystal layer 54, but it is also possible to effect a known reversal development for attaching a toner to the transparent portions by applying a voltage bias.

The transparent paper 61 is sent onto the drum 51 of the image holding member, and the toner image is electrostatically transferred to the transfer paper 61 by a transfer charger 62 (FIG. 14G). The transfer may also be conducted by roller transfer, bias transfer or other known transfer methods. The transfer paper 61 carrying the toner image is sent to a fixing device 64 (thermal fixer or pressure fixer), where the toner image is fixed to provide a hard copy.

The toner remaining on the polymer layer 54 is removed by a cleaner 65, which may be a fur brush 65, a blade cleaner, etc. (FIG. 14H).

The polymer layer is de-charged with respect to the whole area so as to prepare for a subsequent image printing by simultaneous application of a decharger 66 and a whole-area exposure by a lamp 63 from the backside (FIG. 14I).

The process is returned to the step shown in FIG. 14C, and the toner image formation is repeated (FIG. 14J). During the repetitive printing, unnecessary scratching of the polymer layer 54 may be avoided by separating the thermal head 58 away therefrom by a release mechanism (not shown).

[Erasure of intermediate image]

For example, a halogen heater 67 is turned on to illuminate the image holding member 51 which is rotated at a relatively low speed to acquire a relatively long period for passing by the halogen heater 67, whereby the intermediate image on the polymer liquid crystal layer 54 can be erased. In a particular embodiment, the halogen heater 67 and the heat accumulation plate 68 thereof, were controlled so that the maximum temperature on the polymer layer 54 was 85° C. to form a wholly transparent state and the polymer layer 54 was gradually cooled to be restored to a white scattering state. Incidentally, the halogen heater 67 can be disposed outside the image holding member 51.

Further, the above image exposure can also be effected while rotating the image holding member in a plurality of turns. For example, in a first turn or rotation, the drum temperature near the halogen heater 67 is raised so as to provide an isotropic state, and in a second and subsequent turns, the temperature of the image holding member near the halogen heater 67 is brought to a liquid crystal temperature to cause several turns, so as to restore the original scattering state. In this case, the rotation speed of the image holding member 51 can be selected appropriately.

The printing speed in the above-mentioned image formation process can be increased to a high circumferential speed of 200 mm/sec or higher of the image holding member 51 except for the time required for forming the intermediate image on the polymer film.

In the above embodiment, a thermal head is used for recording the intermediate image. In this instance, it is possible to increase the durability of the polymer liquid crystal layer by providing thereon a protective layer of polyimide, aramide or another heat-resistance resin.

The above intermediate image can be formed so as to form a transparent portion at the image portion or non-image portion.

The polymer liquid crystal layer may desirably be formed to provide a resistivity of $10^{13} \Omega \cdot cm$ or higher.

Thirteenth embodiment

The electroconductive substrate 52 may be formed of a conductor, such as aluminum, SUS, etc.

In this embodiment, the illumination wavelength of the exposure lamp 56 shown in FIG. 14D is made a relatively low wavelength (shorter than about 550 nm), the illumination wavelengths of the lamp 57 in FIG. 14E and the lamp 63 in FIG. 141 are made relatively long (longer than about 550 nm), whereby the lamps 57 and 63 can be also disposed outside the drum 51.

This is attributable to the fact that the polymer liquid crystal of the formula (II) in the scattering state has a spectral transmittance which is relatively small in a shorter wavelength side and relatively large in a longer wavelength side. Accordingly, if the lamps 57 and 63 for whole-area exposure emit illumination lights of longer wavelengths, the photoconductive layer 53 can be supplied with a sufficient quantity of illumination light if the exposure is conducted by the medium of the polymer layer.

In a particular embodiment, the illumination lamp 56 was composed of a fluorescent lamp combined with a filter for cutting a wavelength region of about 550 nm. The lamps 57 and 63 were composed of halogen lamps combined with a filter for cutting below 600 nm and a filter for cutting for infrared region:

The wavelengths of the lamps 56, 57 and 63 may generally be appropriately be selected while taking the spectral characteristics of various polymer films 52.

Fourteenth embodiment

In this embodiment, an infrared (semiconductor) laser is used for thermal recording.

FIG. 15A shows a modification of the first embodiment which is different from the twelfth embodiment in that an infrared laser 69 as a thermal recording means is used by the medium of a polygonal mirror 70 for scanning from the exterior for recording.

In a particular example, the polymer liquid crystal used in the twelfth embodiment was dissolved in solvent cyclohexane and in infrared-absorbing dye of the formula:

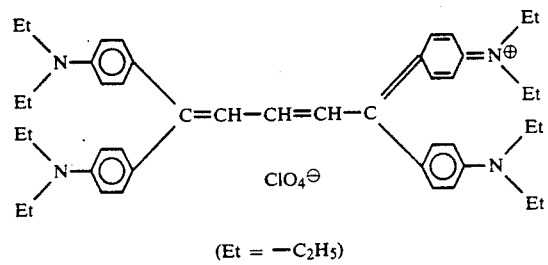

(Et = —C₂H₅)

was added thereto so as to provide weight ratios of polymer liquid crystal/laser-absorbing dye/solvent = 20/1/100. The resultant solution was applied on the inner face of the substrate 1 by dipping in the same manner as in the twelfth embodiment to form an about 15 micron-thick polymer liquid crystal layer 54.

When a laser beam from a 30 mW-laser 70 was used for scanning of the polymer liquid crystal layer 54 by the medium of the polygonal mirror 69, an isotropic transparent image was formed in the scattering state of the polymer liquid crystal layer 54. Then, the drum 51 carrying the thus formed image was subjected to the image forming process in the twelfth embodiment.

In this embodiment, a high density image could be formed on the polymer film by using a laser as a recording source and fine print images could be obtained.

While the present invention has been explained with reference to specific embodiments, but the polymer layer used in this invention may comprise not only a polymer liquid crystal as described above but also a medium by which an intermediate optical image can be reversibly memorized or another medium such as a phase separation polymer.

Further, it is also possible to use a polarization film, etc., again so as to provide an optical image as described above with an increased contrast.

As described above, according to the present invention, there is provided an optical image recording apparatus including a recording layer capable of forming a record which is stable, excellent in memory characteristic and has a high contrast, so that a photosensitive apparatus with less reliance to a semiconductor laser, an optical scanner, etc. There is further provided an electrophotographic printing apparatus wherein an intermediate recorded image of a high contrast is used as an original for repetitive painting in contact with the photoconductive layer so as to allow a high speed and faithful printing.

What is claimed is:
1. An optical image recording apparatus, including:
   an image holding member comprising a polymer recording layer capable of recording and holding data through heat application,
   thermal recording means for applying heat to the polymer recording layer,
   a photosensitive member, and
   exposure means for recording the data recorded by the recording layer on the photosensitive member.
2. An apparatus according to claim 1, wherein said image holding member comprises a substrate laminated with the polymer recording layer.
3. An apparatus according to claim 2, wherein said image holding member further comprises a light-absorbing layer between the substrate and the polymer recording layer.
4. An apparatus according to claim 1, wherein said image holding member is in the form of an endless belt.
5. An apparatus according to claim 1, wherein said thermal recording means comprises a thermal head.
6. An apparatus according to claim 1, wherein said thermal recording means comprises a semiconductor laser.
7. An apparatus according to claim 1, wherein said polymer recording layer comprises a polymer liquid crystal.
8. An apparats according to claim 1, which further includes a corona charger, a developing means, and fixing means.

9. An apparats according to claim 8, which further includes a toner removing means.

10. An optical image recording apparatus, including: member comprising a polymer
an image holding recording layer capable of recording and holding data through heat application,
thermal recording means for applying heat to the polymer recording layer,
a photosensitive member,
exposure means for recording the data recorded by the recording layer on the photosensitive member, and
thermal erasure means for applying heat to the entire face of the image holding member to erase the recorded data.

11. An apparatus according to claim 10, which further includes a corona charger, a developing means, and a fixing means.

12. An apparatus according to claim 11 which further includes a toner removing means.

13. An apparatus according to claim 10, wherein said image holding member comprises a substrate laminated with the polymer recording layer.

14. An apparatus according or claim 13, wherein said image holding member further comprises a light-absorbing layer between the substrate and the polymer recording layer.

15. An apparatus according to claim 10, wherein said image holding member is in the form of an endless belt.

16. An apparatus according to claim 10, wherein said thermal recording means comprises a thermal head.

17. An apparatus according to claim 10, wherein said thermal recording means comprises a semiconductor laser.

18. An apparatus according to claim 10, wherein said polymer recording layer comprises a polymer liquid crystal.

19. An optical image recording means, including:
an image holding member comprising a polymer recording layer capable of recording and holding data through heat application,
thermal recording means for applying heat to the polymer recording layer,
a photosensitive member, and
exposure means for recording the data recorded by the recording layer on the photosensitive member, and
further a corona charger, a developing means, and a fixing means.

20. An means according to claim 19, wherein said image holding member is in the form of an endless belt.

21. An apparatus according to claim 19, wherein said image holding member comprises a substrate laminated with the polymer recording layer.

22. An apparats according to claim 21, wherein said image holding member further comprises a light-absorbing layer between the substrate and the polymer recording layer.

23. An apparatus according to claim 19, wherein said thermal recording means comprises a thermal head.

24. An apparatus according to claim 19, where said thermal recording means comprises a semiconductor laser.

25. An apparatus according to claim 19, wherein said polymer recording layer comprises a polymer liquid crystal.

26. An apparatus according to claim 19, which further includes a toner removing means.

27. An optical image recording means, including:
an image holding member comprising an electroconductive substrate laminated at least with a photoconductive member and a polymer recording layer capable of recording and holding data through heat application,
thermal recording means for applying heat to the polymer recording layer to form a pattern comprising a transparent portion and an opaque portion, and
electrical imaging means for forming an electric charge distribution image on the polymer recording layer.

28. An means according to claim 27, wherein said electrical imaging means includes means for charging the surface of the polymer recording layer, first exposure means for exposing the image holding member from the side of the polymer recording layer, and second exposure means for exposing the image holding member from the side of the electroconductive substrate.

29. An means according to claim 28, which further includes a developing means, and a transfer charger.

30. An means according to claim 29, which further includes a toner removing means.

31. An means according to claim 27, wherein said polymer recording layer comprises a polymer liquid crystal.

32. An apparatus according to claim 27, wherein said thermal recording means comprises a thermal head.

33. An means according to claim 27, wherein said thermal recording means comprises a semiconductor laser.

34. An optical image recording means, including:
an image holding member comprising an electroconductive substrate laminated with a polymer recording layer capable of recording and holding data through heat application,
a photoconductive member,
thermal recording means for applying heat to the polymer recording layer to form a pattern comprising a transparent portion and an opaque portion, and
electrical imaging means for forming an electric charge distribution image on the polymer recording layer.

35. An apparatus according to claim 34, wherein said electrical imaging means includes:
means for charging the surface of the polymer recording layer,
first exposure means for exposing the image holding member from the side of the polymer recording layer, and
second exposure means for exposing the image holding member from the side of the electroconductive substrate.

36. An apparatus according to claim 35, which further includes a developing device and a transfer charger.

37. An apparatus according to claim 36, which further includes a toner removing device.

38. An apparatus according to claim 34, wherein said polymer recording layer comprises a polymer liquid crystal.

39. An apparatus according to claim 34, where said thermal recording means comprises a thermal head.

40. An apparatus according to claim 34, wherein said thermal recording means comprises a semiconductor laser.

41. An image forming method, comprising steps of:
applying heat to a polymer recording layer to form a recorded portion corresponding to given data,
deranging a photoconductive member, and
exposing he charged photoconductive member through the polymer recording layer, to form an electric charge image on the photosensitive member corresponding to the given data.

42. A method according to claim 41, which further comprises a step of attaching a toner to the electric charge image.

43. A method according to claim 42, which further comprises a step of transferring the attached toner.

44. A method according to claim 43, which further comprises steps of erasing the recorded portion of the polymer recording layer, removing the remaining toner on the photoconductive member, and erasing the remaining charge on the photoconductive member.

45. A method according to claim 41, where said polymer recording layer comprises a polymer liquid crystal.

46. An image forming method, comprising steps of:
applying heat to a polymer recording layer disposed on a photoconductive layer to form a recorded portion in the polymer recording layer corresponding to given data,
charging the polymer recording layer, and
exposing the photoconductive layer to form an electric charge image on the recording layer corresponding to the given data.

47. A method according to claim 46, which further comprises a step of attaching a toner to ht electric charge image.

48. A method according to claim 47, which further comprises a step of transferring the attached toner.

49. A method according to claim 48, which further comprises steps of erasing the recorded portion of the polymer recording layer and removing he remaining toner on the photoconductive member.

50. A method according to claim 46, wherein said polymer recording layer comprises a polymer liquid crystal.

* * * * *

UNITED STATES PATENT AND TRADEMARK OFFICE
CERTIFICATE OF CORRECTION

PATENT NO. : 5,038,166
DATED : August 6, 1991
INVENTOR(S) : KAZUO ISAKA, ET AL.

It is certified that error appears in the above-identified patent and that said Letters Patent is hereby corrected as shown below:

Title page:

IN [30] FOREIGN APPLICATION PRIORITY DATA

Insert: --Dec. 21, 1988 [JP] Japan ....... 63-320607--.

COLUMN 1

Line 29, "indurability" should read --in durability--.

COLUMN 5

Line 16, "dn" should read --and--.
    Line 40, "fill" should read --film--.

COLUMN 7

Line 24, "process" should read --process.--.

COLUMN 11

Line 58, "microcapsuoes" should read --microcapsules--.

COLUMN 12

Line 23, "dichroic prims" should read --dichroic prism--.
    Line 33, "including" should read --including a--.
    Line 36, "sheet 54" should read --sheet 5--.

COLUMN 14

Line 7, "of kg/cm$^2$," should read --of 25 kg/cm$^2$,--.

UNITED STATES PATENT AND TRADEMARK OFFICE
CERTIFICATE OF CORRECTION

PATENT NO. : 5,038,166
DATED : August 6, 1991
INVENTOR(S) : KAZUO ISAKA, ET AL.

It is certified that error appears in the above-identified patent and that said Letters Patent is hereby corrected as shown below:

COLUMN 17

Line 22, "FIG. 141" should read --FIG. 14I--.

COLUMN 19

Line 4, "member comprising a polymer" should be deleted.
    Line 5, "an image holding recording layer" should read --an image holding member comprising a polymer recording layer--.
    Line 19, "claim 11" should read --claim 11,--.
    Line 38, "recording means," should read --recording apparatus,--.

COLUMN 20

Line 1, "recording means," should read --recording apparatus,--.
    Line 23, "An means" should read --An apparatus--.
    Line 25, "An means" should read --An apparatus--.
    Line 27, "An means" should read --An apparatus--.
    Line 30, "An means" should read --An apparatus--.
    Line 32, "An means" should read --An apparatus--.
    Line 35, "recording means," should read --recording apparatus,--.

COLUMN 21

Line 7, "deranging" should read --charging--.
    Line 8, "he" should read --the--.

UNITED STATES PATENT AND TRADEMARK OFFICE
CERTIFICATE OF CORRECTION

PATENT NO. : 5,038,166
DATED : August 6, 1991
INVENTOR(S) : KAZUO ISAKA, ET AL.

It is certified that error appears in the above-identified patent and that said Letters Patent is hereby corrected as shown below:

COLUMN 22

Line 13, "ht" should read --the--.

Signed and Sealed this

Second Day of March, 1993

Attest:

STEPHEN G. KUNIN

Attesting Officer — Acting Commissioner of Patents and Trademarks